(12) United States Patent
Yakubo

(10) Patent No.: US 9,196,593 B2
(45) Date of Patent: Nov. 24, 2015

(54) SEMICONDUCTOR DEVICE

(75) Inventor: Yuto Yakubo, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 381 days.

(21) Appl. No.: 12/567,946

(22) Filed: Sep. 28, 2009

(65) Prior Publication Data

US 2010/0078787 A1    Apr. 1, 2010

(30) Foreign Application Priority Data

Oct. 1, 2008  (JP) ................................ 2008-256056

(51) Int. Cl.
*H01L 23/02* (2006.01)
*H01L 23/64* (2006.01)
*G06K 19/077* (2006.01)
*H01L 23/60* (2006.01)

(52) U.S. Cl.
CPC ........ *H01L 23/645* (2013.01); *G06K 19/07749* (2013.01); *H01L 23/60* (2013.01); *H01L 23/642* (2013.01); *H01L 2223/6677* (2013.01); *H01L 2924/0002* (2013.01); *H01L 2924/12044* (2013.01)

(58) Field of Classification Search
CPC .................. H01L 2223/6677; H01L 2924/00; H01L 2224/48227; H01L 2224/73265
USPC .................... 257/679, E25.029, 532
See application file for complete search history.

(56) References Cited

U.S. PATENT DOCUMENTS

| 4,373,163 A | * | 2/1983 | Vandebult ..................... 343/842 |
| 5,075,166 A | | 12/1991 | Sikorski et al. |
| 5,597,631 A | | 1/1997 | Furumoto et al. |
| 5,677,045 A | | 10/1997 | Nagai et al. |
| 5,679,975 A | | 10/1997 | Wyland et al. |
| 5,731,856 A | | 3/1998 | Kim et al. |

(Continued)

FOREIGN PATENT DOCUMENTS

| EP | 0939441 A | 9/1999 |
| EP | 1092739 A | 4/2001 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Ori Nadav
(74) *Attorney, Agent, or Firm* — Eric J. Robinson; Robinson Intellectual Property Law Office, P.C.

(57) ABSTRACT

To provide a semiconductor device whose reliability is improved by increase in resistance to external stress and electrostatic discharge with reduction in thickness and size achieved. An IC chip provided with an integrated circuit and a resonant capacitor portion, an antenna provided over the IC chip, and a conductive blocking body provided so as to at least partially overlap the antenna with an insulating film interposed therebetween are included. A capacitor is formed with a layered structure of the antenna, the insulating film over the antenna, and the conductive blocking body over the insulating film.

10 Claims, 10 Drawing Sheets

(56) References Cited

U.S. PATENT DOCUMENTS

| | | | | |
|---|---|---|---|---|
| 5,744,864 | A | 4/1998 | Cillessen et al. | |
| 5,757,456 | A | 5/1998 | Yamazaki et al. | |
| 5,770,313 | A | 6/1998 | Furumoto et al. | |
| 5,821,138 | A | 10/1998 | Yamazaki et al. | |
| 6,100,177 | A | 8/2000 | Noguchi | |
| 6,118,502 | A | 9/2000 | Yamazaki et al. | |
| 6,215,455 | B1* | 4/2001 | Lamata D'Angelo et al. | 343/842 |
| 6,224,965 | B1 | 5/2001 | Haas et al. | |
| 6,294,274 | B1 | 9/2001 | Kawazoe et al. | |
| 6,323,550 | B1 | 11/2001 | Martin et al. | |
| 6,376,333 | B1 | 4/2002 | Yamazaki et al. | |
| 6,403,221 | B1 | 6/2002 | Nakamura et al. | |
| 6,482,495 | B1 | 11/2002 | Kohama et al. | |
| 6,491,228 | B1 | 12/2002 | Ueda et al. | |
| 6,563,174 | B2 | 5/2003 | Kawasaki et al. | |
| 6,639,299 | B2* | 10/2003 | Aoki | 257/531 |
| 6,727,522 | B1 | 4/2004 | Kawasaki et al. | |
| 6,762,508 | B1 | 7/2004 | Kiso et al. | |
| 6,926,794 | B2 | 8/2005 | Kohama et al. | |
| 6,998,282 | B1 | 2/2006 | Yamazaki et al. | |
| 7,049,178 | B2 | 5/2006 | Kim et al. | |
| 7,049,190 | B2 | 5/2006 | Takeda et al. | |
| 7,050,138 | B1 | 5/2006 | Yamazaki et al. | |
| 7,061,014 | B2 | 6/2006 | Hosono et al. | |
| 7,061,083 | B1 | 6/2006 | Usami et al. | |
| 7,064,346 | B2 | 6/2006 | Kawasaki et al. | |
| 7,105,868 | B2 | 9/2006 | Nause et al. | |
| 7,211,825 | B2 | 5/2007 | Shih et al | |
| 7,282,782 | B2 | 10/2007 | Hoffman et al. | |
| 7,297,977 | B2 | 11/2007 | Hoffman et al. | |
| 7,323,356 | B2 | 1/2008 | Hosono et al. | |
| 7,361,519 | B2 | 4/2008 | Yamazaki et al. | |
| 7,385,224 | B2 | 6/2008 | Ishii et al. | |
| 7,402,506 | B2 | 7/2008 | Levy et al. | |
| 7,411,209 | B2 | 8/2008 | Endo et al. | |
| 7,453,065 | B2 | 11/2008 | Saito et al. | |
| 7,453,087 | B2 | 11/2008 | Iwasaki | |
| 7,462,862 | B2 | 12/2008 | Hoffman et al. | |
| 7,468,304 | B2 | 12/2008 | Kaji et al. | |
| 7,485,489 | B2 | 2/2009 | Bjorbell | |
| 7,487,373 | B2 | 2/2009 | Koyama | |
| 7,501,293 | B2 | 3/2009 | Ito et al. | |
| 7,566,971 | B2 | 7/2009 | Matsuzaki | |
| 7,579,224 | B2 | 8/2009 | Kuwabara et al. | |
| 7,674,650 | B2 | 3/2010 | Akimoto et al. | |
| 7,732,819 | B2 | 6/2010 | Akimoto et al. | |
| 7,858,451 | B2 | 12/2010 | Maekawa et al. | |
| 7,919,861 | B2 | 4/2011 | Matsuzaki | |
| 7,923,796 | B2 | 4/2011 | Shionoiri et al. | |
| 8,222,735 | B2 | 7/2012 | Shionoiri | |
| 2001/0046027 | A1 | 11/2001 | Tai et al. | |
| 2002/0056838 | A1 | 5/2002 | Ogawa | |
| 2002/0132454 | A1 | 9/2002 | Ohtsu et al. | |
| 2003/0032210 | A1 | 2/2003 | Takayama et al. | |
| 2003/0071953 | A1 | 4/2003 | Yamazaki et al. | |
| 2003/0189401 | A1 | 10/2003 | Kido et al. | |
| 2003/0218222 | A1 | 11/2003 | Wager et al. | |
| 2004/0016939 | A1 | 1/2004 | Akiba et al. | |
| 2004/0038446 | A1 | 2/2004 | Takeda et al. | |
| 2004/0127038 | A1 | 7/2004 | Carcia et al. | |
| 2004/0229404 | A1 | 11/2004 | Kiso et al. | |
| 2005/0017302 | A1 | 1/2005 | Hoffman | |
| 2005/0070038 | A1 | 3/2005 | Yamazaki et al. | |
| 2005/0085034 | A1 | 4/2005 | Akiba et al. | |
| 2005/0146006 | A1* | 7/2005 | Yamazaki et al. | 257/679 |
| 2005/0162578 | A1 | 7/2005 | Yamazaki et al. | |
| 2005/0199959 | A1 | 9/2005 | Chiang et al. | |
| 2005/0233122 | A1 | 10/2005 | Nishimura et al. | |
| 2005/0285231 | A1 | 12/2005 | Arao et al. | |
| 2006/0011288 | A1 | 1/2006 | Watanabe et al. | |
| 2006/0035452 | A1 | 2/2006 | Carcia et al. | |
| 2006/0043377 | A1 | 3/2006 | Hoffman et al. | |
| 2006/0091793 | A1 | 5/2006 | Baude et al. | |
| 2006/0108529 | A1 | 5/2006 | Saito et al. | |
| 2006/0108636 | A1 | 5/2006 | Sano et al. | |
| 2006/0110867 | A1 | 5/2006 | Yabuta et al. | |
| 2006/0113536 | A1 | 6/2006 | Kumomi et al. | |
| 2006/0113539 | A1 | 6/2006 | Sano et al. | |
| 2006/0113549 | A1 | 6/2006 | Den et al. | |
| 2006/0113565 | A1 | 6/2006 | Abe et al. | |
| 2006/0169973 | A1 | 8/2006 | Isa et al. | |
| 2006/0170111 | A1 | 8/2006 | Isa et al. | |
| 2006/0197092 | A1 | 9/2006 | Hoffman et al. | |
| 2006/0208977 | A1 | 9/2006 | Kimura | |
| 2006/0228974 | A1 | 10/2006 | Thelss et al. | |
| 2006/0231882 | A1 | 10/2006 | Kim et al. | |
| 2006/0238135 | A1 | 10/2006 | Kimura | |
| 2006/0244107 | A1 | 11/2006 | Sugihara et al. | |
| 2006/0267141 | A1* | 11/2006 | Saito | 257/532 |
| 2006/0267158 | A1 | 11/2006 | Weis | |
| 2006/0284171 | A1 | 12/2006 | Levy et al. | |
| 2006/0284172 | A1 | 12/2006 | Ishii | |
| 2006/0292777 | A1 | 12/2006 | Dunbar | |
| 2007/0004125 | A1 | 1/2007 | Watanabe et al. | |
| 2007/0024187 | A1 | 2/2007 | Shin et al. | |
| 2007/0044303 | A1 | 3/2007 | Yamano | |
| 2007/0046191 | A1 | 3/2007 | Saito | |
| 2007/0052025 | A1 | 3/2007 | Yabuta | |
| 2007/0054507 | A1 | 3/2007 | Kaji et al. | |
| 2007/0077691 | A1 | 4/2007 | Watanabe | |
| 2007/0090365 | A1 | 4/2007 | Hayashi et al. | |
| 2007/0095913 | A1* | 5/2007 | Takahashi et al. | 235/451 |
| 2007/0108446 | A1 | 5/2007 | Akimoto | |
| 2007/0152217 | A1 | 7/2007 | Lai et al. | |
| 2007/0172591 | A1 | 7/2007 | Seo et al. | |
| 2007/0181875 | A1* | 8/2007 | Yamazaki et al. | 257/40 |
| 2007/0187678 | A1 | 8/2007 | Hirao et al. | |
| 2007/0187760 | A1 | 8/2007 | Furuta et al. | |
| 2007/0194379 | A1 | 8/2007 | Hosono et al. | |
| 2007/0252706 | A1* | 11/2007 | Furutani | 340/572.8 |
| 2007/0252928 | A1 | 11/2007 | Ito et al. | |
| 2007/0257292 | A1* | 11/2007 | Shionoiri | 257/300 |
| 2007/0259585 | A1 | 11/2007 | Yamazaki et al. | |
| 2007/0272922 | A1 | 11/2007 | Kim et al. | |
| 2007/0278563 | A1 | 12/2007 | Takano et al. | |
| 2007/0287296 | A1 | 12/2007 | Chang | |
| 2008/0006877 | A1 | 1/2008 | Mardilovich et al. | |
| 2008/0012126 | A1 | 1/2008 | Dozen et al. | |
| 2008/0036608 | A1 | 2/2008 | Sakama | |
| 2008/0038882 | A1 | 2/2008 | Takechi et al. | |
| 2008/0038929 | A1 | 2/2008 | Chang | |
| 2008/0044940 | A1 | 2/2008 | Watanabe et al. | |
| 2008/0050595 | A1 | 2/2008 | Nakagawara et al. | |
| 2008/0054976 | A1 | 3/2008 | Endo et al. | |
| 2008/0073653 | A1 | 3/2008 | Iwasaki | |
| 2008/0083950 | A1 | 4/2008 | Pan et al. | |
| 2008/0093464 | A1 | 4/2008 | Dairiki et al. | |
| 2008/0106191 | A1 | 5/2008 | Kawase | |
| 2008/0128689 | A1 | 6/2008 | Lee et al. | |
| 2008/0129195 | A1 | 6/2008 | Ishizaki et al. | |
| 2008/0166834 | A1 | 7/2008 | Kim et al. | |
| 2008/0182358 | A1 | 7/2008 | Cowdery-Corvan et al. | |
| 2008/0186181 | A1 | 8/2008 | Kurokawa | |
| 2008/0224133 | A1 | 9/2008 | Park et al. | |
| 2008/0224940 | A1 | 9/2008 | Sugiyama et al. | |
| 2008/0224941 | A1 | 9/2008 | Sugiyama et al. | |
| 2008/0242005 | A1 | 10/2008 | Dozen et al. | |
| 2008/0254569 | A1 | 10/2008 | Hoffman et al. | |
| 2008/0258139 | A1 | 10/2008 | Ito et al. | |
| 2008/0258140 | A1 | 10/2008 | Lee et al. | |
| 2008/0258141 | A1 | 10/2008 | Park et al. | |
| 2008/0258143 | A1 | 10/2008 | Kim et al. | |
| 2008/0296568 | A1 | 12/2008 | Ryu et al. | |
| 2008/0303140 | A1 | 12/2008 | Ohtani et al. | |
| 2009/0068773 | A1 | 3/2009 | Lai et al. | |
| 2009/0073325 | A1 | 3/2009 | Kuwabara et al. | |
| 2009/0085182 | A1 | 4/2009 | Yamazaki et al. | |
| 2009/0114910 | A1 | 5/2009 | Chang | |
| 2009/0134399 | A1 | 5/2009 | Sakakura et al. | |
| 2009/0152506 | A1 | 6/2009 | Umeda et al. | |
| 2009/0152541 | A1 | 6/2009 | Maekawa et al. | |
| 2009/0278122 | A1 | 11/2009 | Hosono et al. | |
| 2009/0278252 | A1 | 11/2009 | Oikawa et al. | |

(56) References Cited

U.S. PATENT DOCUMENTS

| | | | |
|---|---|---|---|
| 2009/0280600 | A1 | 11/2009 | Hosono et al. |
| 2009/0289341 | A1 | 11/2009 | Yamazaki et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |

FOREIGN PATENT DOCUMENTS

| | | | |
|---|---|---|---|
| EP | 1589797 | A | 10/2005 |
| EP | 1737044 | A | 12/2006 |
| EP | 1758438 | A | 2/2007 |
| EP | 1970951 | A | 9/2008 |
| EP | 2226847 | A | 9/2010 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-190582 | A | 7/1993 |
| JP | 05-251705 | A | 9/1993 |
| JP | 08-250745 | | 9/1996 |
| JP | 08-250745 | A | 9/1996 |
| JP | 08-264794 | A | 10/1996 |
| JP | 08-288522 | A | 11/1996 |
| JP | 09-156265 | | 6/1997 |
| JP | 10-092980 | A | 4/1998 |
| JP | 10-129165 | A | 5/1998 |
| JP | 10-181261 | A | 7/1998 |
| JP | 10-211784 | | 8/1998 |
| JP | 10-302027 | A | 11/1998 |
| JP | 11-505377 | | 5/1999 |
| JP | 11-353440 | A | 12/1999 |
| JP | 2000-044236 | A | 2/2000 |
| JP | 2000-150900 | A | 5/2000 |
| JP | 2000-231619 | A | 8/2000 |
| JP | 2001-260580 | A | 9/2001 |
| JP | 2001-277726 | A | 10/2001 |
| JP | 2002-043516 | A | 2/2002 |
| JP | 2002-049903 | A | 2/2002 |
| JP | 2002-076356 | A | 3/2002 |
| JP | 2002-246829 | A | 8/2002 |
| JP | 2002-289859 | A | 10/2002 |
| JP | 2003-086000 | A | 3/2003 |
| JP | 2003-086808 | A | 3/2003 |
| JP | 2003-141486 | | 5/2003 |
| JP | 2003-174153 | A | 6/2003 |
| JP | 2004-094492 | | 3/2004 |
| JP | 2004-103957 | A | 4/2004 |
| JP | 2004-118255 | A | 4/2004 |
| JP | 2004-153717 | A | 5/2004 |
| JP | 2004-273614 | A | 9/2004 |
| JP | 2004-273732 | A | 9/2004 |
| JP | 2004-362341 | A | 12/2004 |
| JP | 2006-108654 | A | 4/2006 |
| JP | 2006-139802 | A | 6/2006 |
| JP | 2007-005778 | A | 1/2007 |
| JP | 2007-005782 | A | 1/2007 |
| JP | 2007-134694 | A | 5/2007 |
| JP | 2007-241999 | A | 9/2007 |
| JP | 2008-084303 | A | 4/2008 |
| JP | 2008-210380 | A | 9/2008 |
| WO | WO-96/09158 | A | 3/1996 |
| WO | WO-01/01740 | A | 1/2001 |
| WO | WO-2004/001848 | | 12/2003 |
| WO | WO-2004/114391 | | 12/2004 |
| WO | WO2006/038438 | | 4/2006 |
| WO | WO-2007/043602 | | 4/2007 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$—$ZnGa_2O_4$—ZnO System,", Journal of Solid State Chemistry, Apr. 1, 1995, vol. 116, No. 1, pp. 170-178.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

(56) References Cited

OTHER PUBLICATIONS

Kurokawa.Y et al., "UHF RFCPUS on Flexible and Glass Substrates for Secure RFID System,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Nomura.K et al., "Thin-Film Transistor Fabricated in Single-Crystalline Transparent Oxide Semiconductor,", Science, May 23, 2003, vol. 300, No. 5623, pp. 1269-1272.

Nomura.K et al., "Carrier transport in transparent oxide semiconductor with intrinsic structural randomness probed using single-crystal-

(56) References Cited

OTHER PUBLICATIONS line InGaO3(ZnO)5 films,", Appl. Phys. Lett. (Applied Physics Letters), Sep. 13, 2004, vol. 85, No. 11, pp. 1993-1995.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

International Search Report (Application No. PCT/JP2009/065970) Dated Oct. 20, 2009.

Written Opinion (Application No. PCT/JP2009/065970) Dated Oct. 20, 2009.

Korean Office Action (Application No. 2011-7009849) Dated Sep. 2, 2015.

\* cited by examiner

1101

1102

1103

1001

1002

1003

1004

1005

1006

1007

SEMICONDUCTOR DEVICE

TECHNICAL FIELD

The present invention relates to a semiconductor device such as a wireless chip capable of communicating data through wireless communication.

BACKGROUND ART

In recent years, with the spread of the Internet, IT (Information Technology) has spread all over the world and revolutionized society. In particular, recently, an environment where the network can be accessed anytime and anywhere has been developed as is called a ubiquitous information society. In such an environment, individual identification technology has attracted attention, where ID (identification number) is assigned to each object so that the history thereof is revealed and utilized in production, management, and the like. Specifically, RFIDs (radio frequency identification) such as wireless chips (also called ID tags, IC tags, IC chips, RF (radio frequency) tags, wireless tags, and electronic tags) are beginning to be introduced in companies, markets, and the like on a trial basis. Such semiconductor devices such as wireless chips are mounted on cards or the like and the semiconductor devices have recently been suggested to be applied in a variety of fields (for example, Patent Document 1).

With the expansion of the market of semiconductor devices, there have been a variety of requirements of a shape, characteristics, and the like. For example, as a requirement regarding shapes, further reduction in size and thickness, and the like are given. In addition, as a requirement regarding characteristics, increase in strength, resistance to electrostatic discharge, and the like which is related to reliability are given.

REFERENCE

[Patent Document 1] Japanese Published Patent Application No. 2001-260580

DISCLOSURE OF INVENTION

However, in general, it is significantly difficult to achieve both reduction in size and thickness and improvement of reliability of the semiconductor devices.

As a method for downsizing an IC chip, for example, there is a method in which an antenna and an IC chip are disposed so as to be overlapped with each other. However, in the case where an antenna and an IC chip are disposed so as to be overlapped with each other in a wireless chip, in general, an integrated circuit might malfunction due to parasitic capacitance between the antenna and the IC chip.

In the semiconductor devices, electrostatic discharge from the outside becomes a more serious problem as the semiconductor devices are reduced in thickness and size. Therefore, for example, productivity might be reduced by the time the semiconductor devices are used as products after the manufacturing process and inspection are completed.

In view of the above problems, an object of the present invention is to provide a semiconductor device whose reliability is improved by increase in resistance to external stress and electrostatic discharge with reduction in thickness and size achieved.

An embodiment of the present invention provides a wireless chip having the following structure to achieve the above object.

According to an embodiment of the present invention, an IC chip including an integrated circuit and a resonant capacitor portion, an antenna provided over the IC chip, and a conductive blocking body provided so as to at least partially overlap the antenna with an insulating film interposed therebetween are included. A capacitor is formed with a layered structure of the antenna, the insulating film over the antenna, and the conductive blocking body over the insulating film.

According to an embodiment of the present invention, a conductive blocking body, an insulating film provided over the conductive blocking body, an IC chip provided with an integrated circuit and a resonant capacitor portion and provided over the insulating film, and an antenna provided over the IC chip are included. The conductive blocking body and the antenna are provided so as to be at least partially overlapped with each other with the insulating film and the IC chip interposed therebetween. A capacitor is formed with a layered structure of the conductive blocking body, the insulating film, and the antenna.

According to an embodiment of the present invention, an IC chip provided with an integrated circuit and a resonant capacitor portion, an antenna provided over the IC chip, an insulating film provided so as to surround the IC chip and the antenna, and a conductive blocking body provided so as to surround the insulating film. A capacitor is formed with a layered structure of the antenna, the insulating film, and the conductive blocking body.

According to an embodiment of the present invention, a resonant capacitor portion includes a wiring, and a capacitor is formed with a layered structure of the resonant capacitor portion, an insulating film, and a conductive blocking body.

According to an embodiment of the present invention, a first conductive blocking body, a first insulating film provided over the first conductive blocking body, an IC chip provided with an integrated circuit and a resonant capacitor portion and provided over the first insulating film, an antenna provided over the IC chip, a second insulating film provided over the antenna, and a second conductive blocking body provided over the second insulating film are included. The first conductive blocking body and the antenna are provided so as to be partially overlapped with each other with the first insulating film and the IC chip interposed therebetween. The second conductive blocking body and the antenna are provided so as to be partially overlapped with each other with the second insulating film interposed therebetween. A capacitor is formed with a layered structure of the first conductive blocking body, the first insulating film, and the antenna and another capacitor is formed with a layered structure of the second conductive blocking body, the second insulating film, and the antenna.

According to an embodiment of the present invention, a resonant capacitor portion includes a wiring, a capacitor is formed with a layered structure of the resonant capacitor portion, a first insulating film, and a first conductive blocking body and another capacitor is formed with a layered structure of a second resonant capacitor portion, a second insulating film, and a second conductive blocking body.

The insulating film according to an embodiment of the present invention includes an impact diffusion layer.

The first insulating film and the second insulating film according to an embodiment of the present invention each include an impact diffusion layer.

The impact diffusion layer according to an embodiment of the present invention is a structure body in which a fibrous body is impregnated with an organic resin.

By using an embodiment of the present invention, a capacitor is formed between a conductive blocking body and an antenna and the number of capacitors of a resonant capacitor portion formed in a chip can be reduced as compared to the case where a conductive blocking body is not provided. Accordingly, the size of a wireless chip and the size of an IC chip can be reduced and the limited area in the IC chip and the wireless chip can be utilized efficiently. Further, since the sizes of the IC chip and the wireless chip can be reduced, current consumption can be reduced and thus a communication distance can be prevented from being shortened.

Further, by using the conductive blocking body, resistance to static electricity and physical strength of the wireless chip, which becomes a significant problem when the wireless chip is downsized, can be increased.

BEST MODE FOR CARRYING OUT THE INVENTION

Figure 1A:
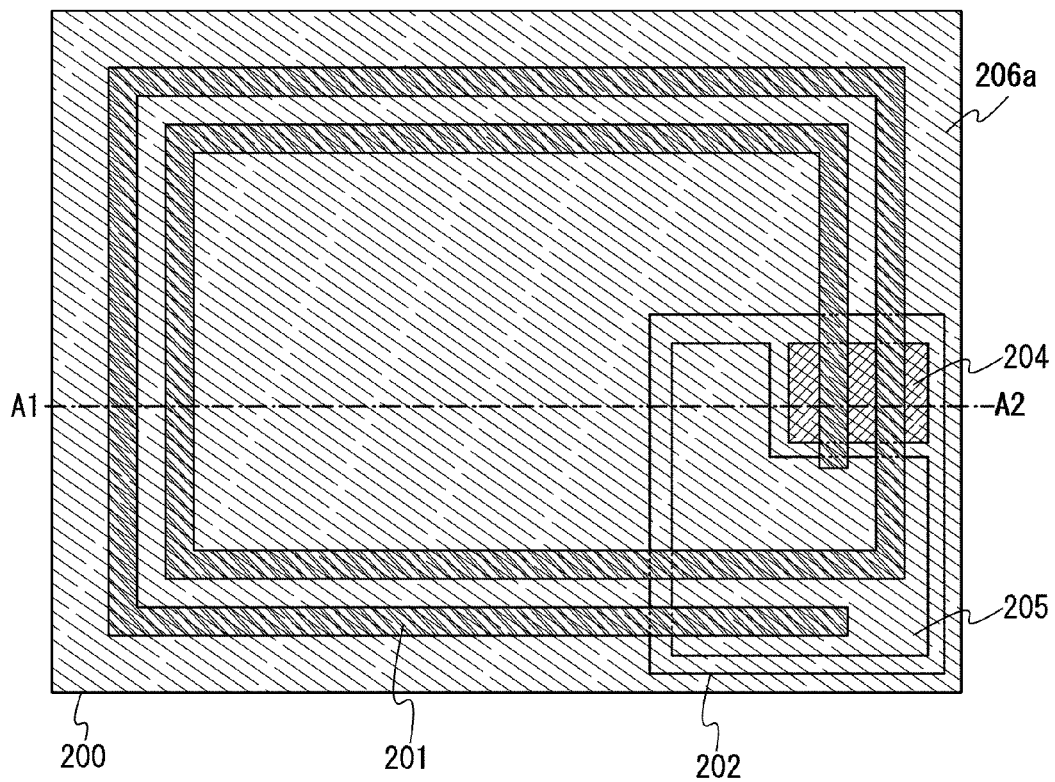
FIGS. 1A and 1B illustrate a structure of a wireless chip of an embodiment of the present invention (Embodiment 1)

The embodiments and example of the present invention will be specifically described with reference to the drawings. However, the present invention disclosed herein is not limited to the following description because it will be easily understood by those skilled in the art that various changes and modifications can be made to the modes and their details without departing from the spirit and scope of the present invention disclosed herein. Therefore, the present invention disclosed herein should not be construed as being limited to the description in the following embodiments and example. Note that a common reference numeral refers to the same part throughout the drawings in the structure of the present invention described below. Although a capacitor is provided also in a portion other than the portion which is shown, a capacitor other than a typical capacitor is not shown.

In the following embodiments, part of structural examples using the present invention will be described with reference to drawings.

Embodiment 1

A structure of a wireless chip 200 of FIG. 1A will be described. FIG. 1B is a cross section taken along line A1-A2 in the wireless chip 200 of FIG. 1A.

Figure 1B:
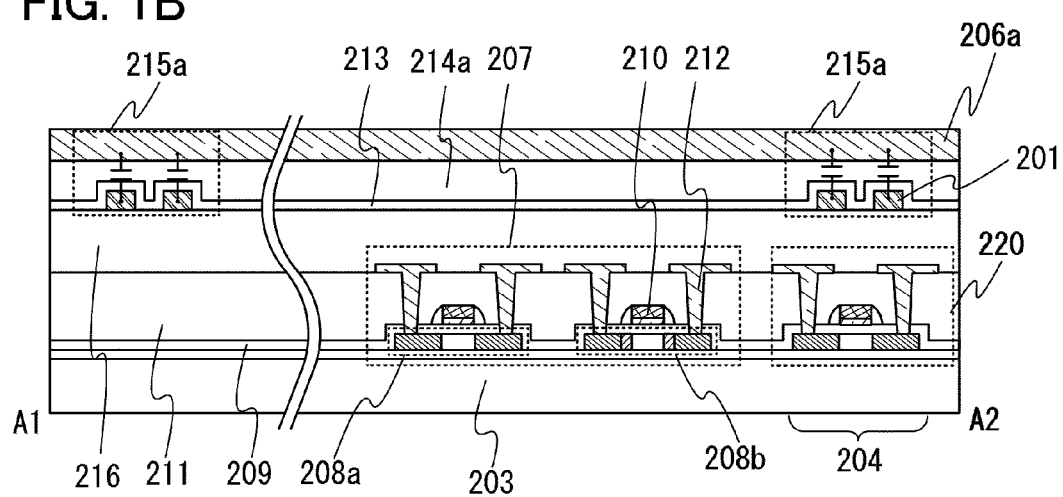

As illustrated in FIGS. 1A and 1B, a wireless chip 200 described in this embodiment includes an antenna 201 and an IC chip 202 that are stacked over the same substrate 203. The antenna 201 and the IC chip 202 are disposed so as to be at least partially overlapped with each other with an insulating film interposed therebetween. The IC chip 202 includes a resonant capacitor portion 204 in the chip, which is provided with a capacitor 220, and a logic portion 205 including a power supply generating means, a control means, a memory means, and the like. Note that both terminals of the antenna 201 are electrically connected to an integrated circuit 207 of the logic portion 205. Further, a conductive blocking body 206a is disposed so as to overlap an antenna 201 with insulating films such as a protective film 213 and an impact diffusion layer 214a interposed therebetween, so that the conductive blocking body 206a is provided on the uppermost surface of the wireless chip 200.

This embodiment will describe a structure in which a capacitor 215a includes the antenna 201 and the conductive blocking body 206a, and the conductive blocking body 206a is provided above the substrate 203.

The integrated circuit 207 includes at least semiconductor films 208a and 208b each having an impurity region, a gate electrode 210 provided over the semiconductor films 208a and 208b with a gate insulating film 209 interposed therebetween, a first interlayer insulating film 211 provided so as to cover the gate electrode 210, and source and drain electrodes 212 provided over the first interlayer insulating film 211 and electrically connected to the impurity regions of the semiconductor films 208a and 208b.

Further, the antenna 201 connected to the integrated circuit 207 is disposed with a second interlayer insulating film 216 interposed therebetween. The conductive blocking body 206a is disposed over the antenna 201 with the protective film 213 and the impact diffusion layer 214a interposed therebetween. Note that the conductive blocking body 206a is not connected to the antenna 201 physically.

According to the above structure, the conductive blocking body 206a and the antenna 201 function as electrodes with the protective film 213 and the impact diffusion layer 214a interposed therebetween, so that the capacitor 215a is formed.

Next, a manufacturing method of the above structure will be briefly described below.

First, the substrate 203 is prepared. As the substrate 203, a glass substrate such as barium borosilicate glass and aluminoborosilicate glass, a quartz substrate, a ceramic substrate, and the like can be used. Alternatively, a metal substrate including stainless steel or a semiconductor substrate having a surface provided with an insulating film may be employed. Although a substrate formed of a flexible synthetic resin such as plastic generally has a lower resistance temperature than the aforementioned substrates, it may be used as long as being resistant to a processing temperature during manufacturing steps. Note that the surface of the substrate 203 may be planarized by polishing such as a CMP method.

Then, the integrated circuit 207 included in the logic portion 205 is formed over the substrate 203. The integrated circuit 207 has at least the semiconductor films 208a and 208b, the gate electrode 210 provided over the semiconductor films 208a and 208b with the gate insulating film 209 interposed therebetween, the first interlayer insulating film 211 provided so as to cover the gate electrode 210, and the source and drain electrodes 212 provided over the first interlayer insulating film 211. Note that the capacitor 220 may be formed through the same steps as and in a similar manner to the element included in the integrated circuit 207; therefore, description thereof is omitted here.

The semiconductor films 208a and 208b may have any state selected from an amorphous semiconductor, a semiconductor where an amorphous state and a crystalline state are mixed, a microcrystalline semiconductor where a crystal grain with sizes from 0.5 to 20 nm can be observed, and a crystalline semiconductor. In this embodiment, an amorphous semiconductor film is formed and crystallized by heat treatment to obtain the semiconductor films 208a and 208b. The heat treatment can be performed by using a furnace, laser irradiation, irradiation of light emitted from a lamp instead of a laser beam (lamp annealing), or a combination of them.

Next, the gate insulating film 209 is formed so as to cover the semiconductor films 208a and 208b. The gate insulating film 209 can be formed to have a single-layer structure or a layered structure using, for example, any of silicon oxide, silicon nitride, silicon nitride oxide, and the like. The deposition may be performed by a plasma CVD method, a sputtering method, or the like.

Then, the gate electrode 210 is formed over each of the semiconductor films 208a and 208b with the gate insulating film 209 interposed therebetween. The gate electrode 210 may be formed to have a single-layer structure or a layered structure of a plurality of metal films. The gate electrode 210 may be formed by a CVD method or a sputtering method using an element selected from tantalum (Ta), tungsten (W), titanium (Ti), molybdenum (Mo), aluminum (Al), copper (Cu), chromium (Cr), and neodymium (Nd), or an alloy or compound material mainly containing any of these elements. In this embodiment, a first conductive layer and a second conductive layer are stacked in this order using tantalum nitride and tungsten (W), respectively.

Then, impurities imparting n-type or p-type conductivity are selectively added to the semiconductor films 208a and 208b using the gate electrode 210 or a resist that has been patterned as a mask. Each of the semiconductor films 208a and 208b has a channel forming region and impurity regions (including a source region, a drain region, and an LDD region), and an n-channel thin film transistor (hereinafter also referred to as an n-channel TFT) or a p-channel thin film transistor (hereinafter also referred to as a p-channel TFT) can be obtained depending on the conductivity of the added impurity elements.

In FIG. 1B, an n-channel TFT has side walls at sides of the gate electrode 210. The semiconductor film 208b of the n-channel TFT is selectively added with impurities imparting n-type conductivity to form a source region, a drain region, and an LDD region. Meanwhile, the semiconductor film 208a of a p-channel TFT is selectively added with impurities imparting p-type conductivity, so that a source region and a drain region are formed. In this embodiment, the side walls are formed at sides of the gate electrode 210 and the LDD region is selectively formed in the n-channel TFT; however, an embodiment of the present invention is not limited to this structure. An LDD region may also be formed in the p-channel TFT, and aside wall is not necessarily formed in the p-channel TFT. Alternatively, a CMOS structure where an n-channel TFT and a p-channel TFT are used in a complementary manner may be employed.

Next, the first interlayer insulating film 211 is formed so as to cover the gate electrode 210. The first interlayer insulating film 211 may be formed to have a single-layer structure or a layered structure of an insulating film containing oxygen or nitrogen, such as silicon oxide ($SiO_x$), silicon nitride ($SiN_x$), silicon oxynitride ($SiO_xN_y$) (x>y), and silicon nitride oxide ($SiN_xO_y$) (x>y). Alternatively, a resin material such as an epoxy resin, an acrylic resin, a phenol resin, a novolac resin, a melamine resin, a urethane resin, or a silicone resin may be used. Alternatively, the first interlayer insulating film 211 may be formed using an organic material such as benzocyclobutene, parylene, fluorinated arylene ether, or polyimide, a compound material obtained by polymerization such as siloxane-based polymer, a composition material containing water-soluble homopolymer and water-soluble copolymer, or the like.

After that, the source and drain electrodes 212 are formed over the first interlayer insulating film 211. The source and drain electrodes 212 are electrically connected to the impurity regions of the semiconductor films 208a and 208b. In FIG. 1B, a wiring is formed using the same material as the source and drain electrodes 212. The source and drain electrodes 212 and the wiring may be formed to have a single-layer structure or a layered structure using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy or compound material mainly containing any of these elements by a CVD method, a sputtering method, or the like. The alloy material mainly containing aluminum is, for example, a material that contains aluminum as a main component and contains nickel, or an alloy material that contains aluminum as a main component and contains nickel and one or both of carbon and silicon. The source and drain electrodes 212 and the wiring may be formed to have, for example, a layered structure of a barrier film, an aluminum silicon (Al—Si) film and a barrier film, or a layered structure of a barrier film, an aluminum silicon (Al—Si) film, a titanium nitride film, and a barrier film. Note that the barrier film is a thin film containing titanium, nitride of titanium, molybdenum, or nitride of molybdenum. Aluminum and aluminum silicon have a low resistance value and are inexpensive; therefore, they are suitable for the source and drain electrodes 212 and the wiring. When the barrier films are formed for the top layer and the bottom layer, hillock formation in aluminum and aluminum silicon can be prevented. If the barrier film is formed of titanium that is a highly reducing element, even when a thin natural oxide film is formed on the semiconductor films 208a and 208b, the natural oxide film can be reduced and contact with the semiconductor films 208a and 208b can be improved.

Then, the second interlayer insulating film 216 is formed so as to cover the source and drain electrodes 212 and the wiring. The second interlayer insulating film 216 may be formed using any of the above materials for the first interlayer insulating film 211.

Then, the antenna 201 is formed over the second interlayer insulating film 216, a protective film 213 is formed over the antenna 201, an impact diffusion layer 214a is formed over the protective film 213, and a conductive blocking body 206a is formed over the impact diffusion layer 214a, whereby the wireless chip 200 is completed. The antenna 201 is formed to have a single-layer structure or a layered structure using a conductive material by a CVD method, a sputtering method, a screen printing method, a droplet discharge method, or the like. The conductive material is an element selected from aluminum (Al), titanium (Ti), silver (Ag), copper (Cu), gold (Au), and nickel (Ni), or an alloy or compound material mainly containing any of these elements. The protective film 213 can be formed using any of the above materials for the first interlayer insulating film 211. Note that, the coil antenna 201 wound twice is used as one electrode of the capacitor 215a in FIGS. 1A and 1B; however, an embodiment of the present invention is not limited to this and an antenna wound once or a plurality of times may be used as one electrode of the capacitor 215a. As the impact diffusion layer 214a, for example, a structure body in which a fibrous body is impregnated with an organic resin, or the like can be used. In this case, the impact diffusion layer 214a may be bonded to the protective film 213. The conductive blocking body 206a can be formed by a dry process such as a sputtering method, a plasma CVD method, or an evaporation method, or a wet process such as a coating method, a printing method, or a droplet discharge method (inkjet method).

Note that this embodiment describes the case where one of two electrodes of the capacitor 215a is the antenna 201 and the other is the conductive blocking body 206a, and the protective film 213 and the impact diffusion layer 214a are provided between the antenna 201 and the conductive blocking body 206a, but an embodiment of the present invention is not limited to this. A structure may alternatively be employed in which only the protective film 213 or the impact diffusion layer 214a is provided between the electrodes. Still alternatively, an insulating film other than the protective film and the impact diffusion layer described here may be disposed. That is, any other structure than the structure described in this embodiment can be employed as long as a capacitor can be formed.

With the above structure, a capacitor 215a is formed between the conductive blocking body 206a and the antenna 201, and the number of capacitors in the capacitor 220 of the resonant capacitor portion 204 formed in the chip can be reduced as compared to the case where the conductive blocking body 206a is not disposed. Accordingly, the size of the wireless chip 200 and the size of the IC chip 202 can be reduced and the limited area in the IC chip and the wireless chip can be utilized efficiently. Further, since the sizes of the IC chip and the wireless chip can be reduced, current consumption can be reduced and thus a communication distance can be prevented from being shortened. Further, by using the conductive blocking body 206a, resistance to static electricity and physical strength of the wireless chip, which becomes a significant problem when the wireless chip is downsized, can be increased.

Embodiment 2

In this embodiment, a wireless chip 200 having a structure different from that of the above embodiment is described with reference to drawings. In specific, the structure will be described in which the antenna 201 is provided as one of two electrodes of the capacitor 215b and the conductive blocking body 206b as the other electrode is disposed below the substrate 203.

A structure of the wireless chip 200 of FIG. 2A will be described. FIG. 2B is a cross section taken along line A1-A2 in the wireless chip 200 of FIG. 2A.

Figure 2A:
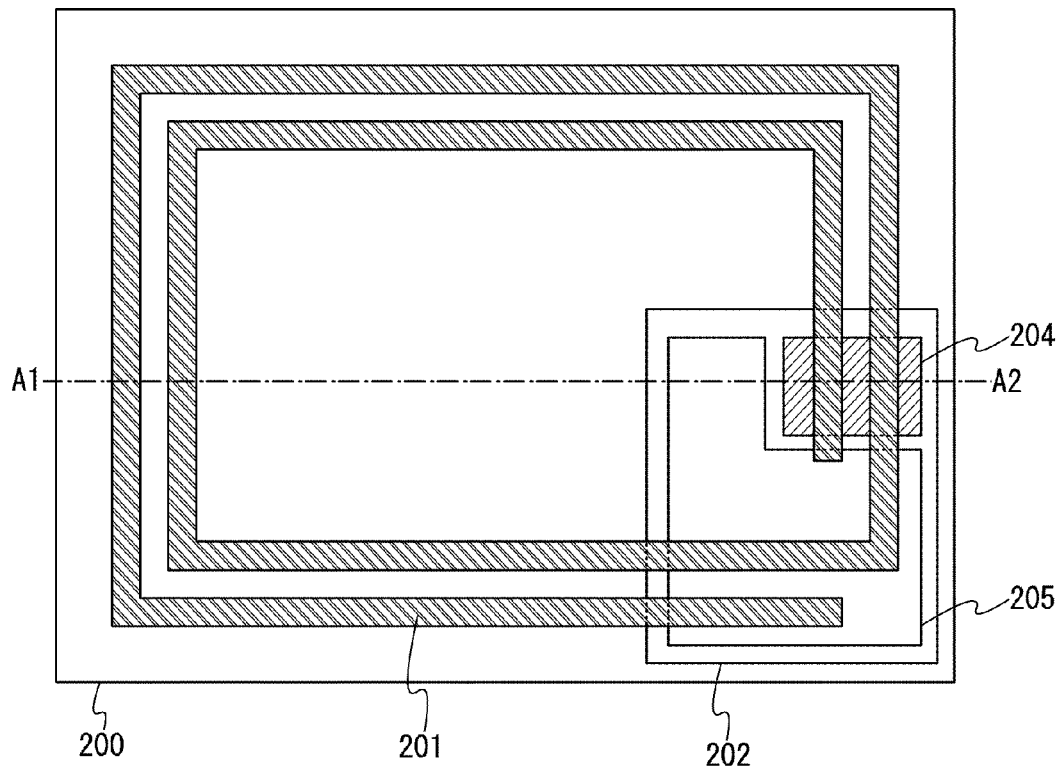
FIGS. 2A and 2B illustrate a structure of a wireless chip of an embodiment of the present invention (Embodiment 2)
Figure 2B:
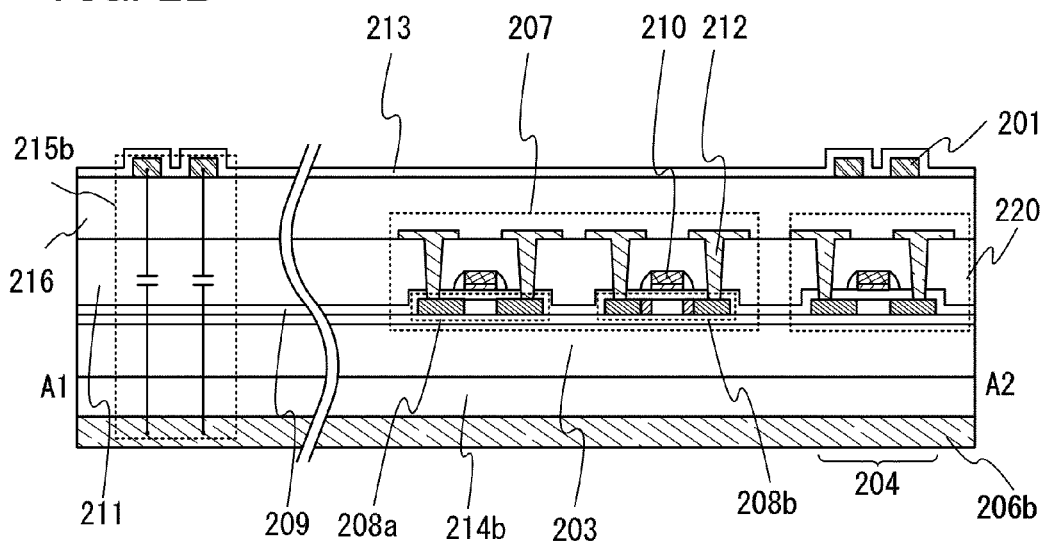

FIGS. 2A and 2B illustrate a structure in which the antenna 201 is provided as one of the two electrodes of the capacitor 215b and the conductive blocking body 206b as the other electrode is disposed below the substrate 203. The wireless chip 200 described in this embodiment includes an antenna 201 and an IC chip 202 that are stacked over the same substrate 203, and the antenna 201 and the IC chip 202 are disposed so as to be at least partially overlapped with each other with an insulating film interposed therebetween. The IC chip 202 includes the resonant capacitor portion 204 in the chip, which is provided with the capacitor 220, and a logic portion 205 including a power supply generating means, a control means, a memory means, and the like. Note that the two terminals of the antenna 201 are electrically connected to the integrated circuit 207 of the logic portion 205. Further, the antenna 201 and the conductive blocking body 206b are disposed with the substrate 203, the first interlayer insulating film 211, the second interlayer insulating film 216, the protective film 213, the impact diffusion layer 214b, and the like interposed therebetween. Note that the conductive blocking body 206b is provided for the lowermost layer of the wireless chip 200.

Further, the antenna 201 connected to the integrated circuit 207 is disposed with the second interlayer insulating film 216 interposed therebetween as in the above embodiment. In this embodiment, the impact diffusion layer 214b is formed under the substrate 203, and the conductive blocking body 206b is formed under the impact diffusion layer 214b. The conductive blocking body 206b is not connected to the antenna 201 physically.

In this embodiment, the conductive blocking body 206b and the antenna 201 function as electrodes with the substrate 203, the first interlayer insulating film 211, the second interlayer insulating film 216, and the impact diffusion layer 214b interposed therebetween, so that the capacitor 215b is formed.

Note that this embodiment describes the case where one of two electrodes of the capacitor 215b is the antenna 201 and the other is the conductive blocking body 206b, and the substrate 203, the first interlayer insulating film 211, the second interlayer insulating film 216, the protective film 213, the impact diffusion layer 214b, and the like are provided between the antenna 201 and the conductive blocking body 206b, but an embodiment of the present invention is not limited to this. Any other structure than the structure described in this embodiment can be employed as long as a capacitor can be formed.

With the above structure, a capacitor 215b is formed between the conductive blocking body 206b and the antenna 201 and the number of capacitors in the capacitor 220 of the resonant capacitor portion 204 required to be formed in the chip can be reduced as compared to the case where the conductive blocking body 206b is not disposed. Accordingly, the size of the wireless chip 200 and the size of the IC chip 202 can be reduced and the limited area in the IC chip and the wireless chip can be utilized efficiently. Further, since the sizes of the IC chip and the wireless chip can be reduced, current consumption can be reduced and thus a communication distance can be prevented from being shortened. Further, by using the conductive blocking body 206b, resistance to static electricity and physical strength of the wireless chip, which becomes a significant problem when the wireless chip is downsized, can be increased. Further, since the conductive blocking body 206b is not provided over the antenna, favorable communication accuracy can be secured without hindering reception of carrier waves or amplitude modulation waves transmitted from a R/W as compared to the structure described in Embodiment 1.

Embodiment 3

In this embodiment, the wireless chip 200 having a structure different from those of Embodiments 1 and 2 is described with reference to drawings. In specific, the wireless chip 200 includes the capacitor 215a and a capacitor 215c. The capacitor 215a has a structure similar to that in Embodiment 1 and is formed to have a layered structure of the antenna 201, the protective film 213, the impact diffusion layer 214a, and the conductive blocking body 206a. Further, the structure will be described in which the antenna 201 is provided as one of two electrodes of the capacitor 215c, and both the conductive blocking body 206a provided over the substrate 203 and the conductive blocking body 206b provided under the substrate 203 are disposed as the other electrodes.

A structure of the wireless chip 200 of FIG. 3A will be described. FIG. 3B is a cross section taken along line A1-A2 in the wireless chip 200 of FIG. 3A.

Figure 3A:
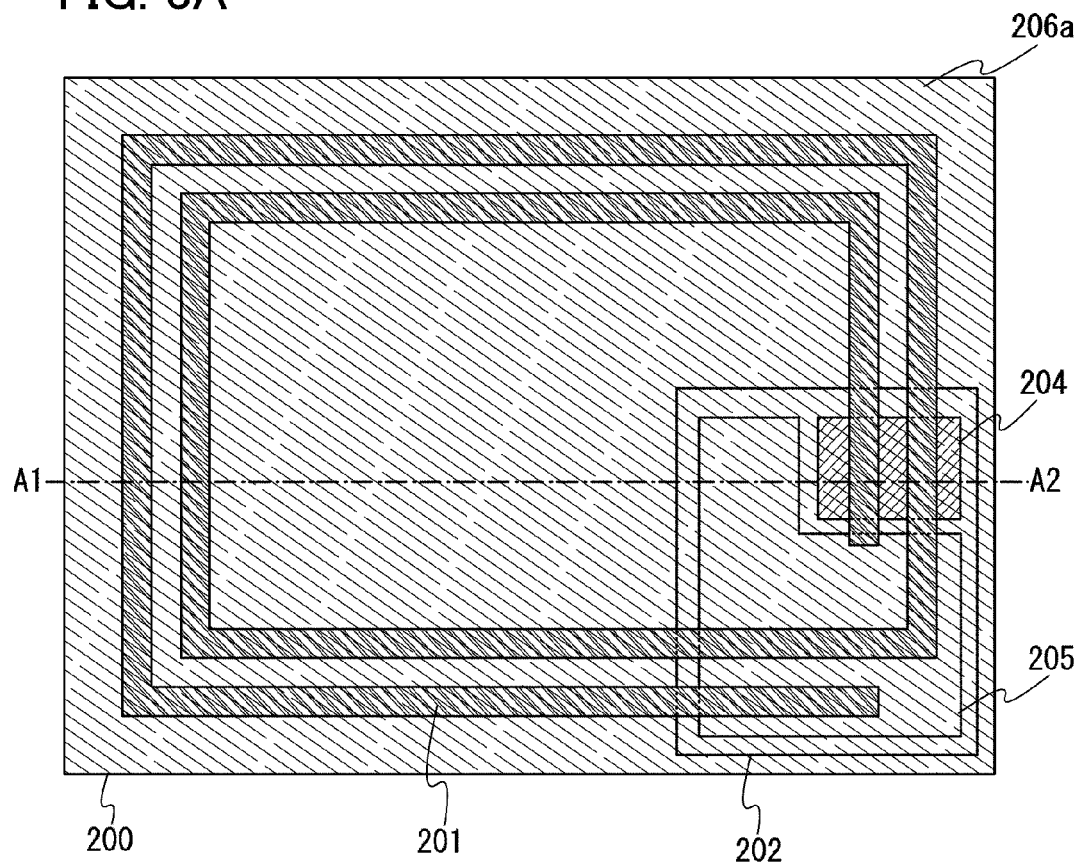
FIGS. 3A and 3B illustrate a structure of a wireless chip of an embodiment of the present invention (Embodiment 3)
Figure 3B:
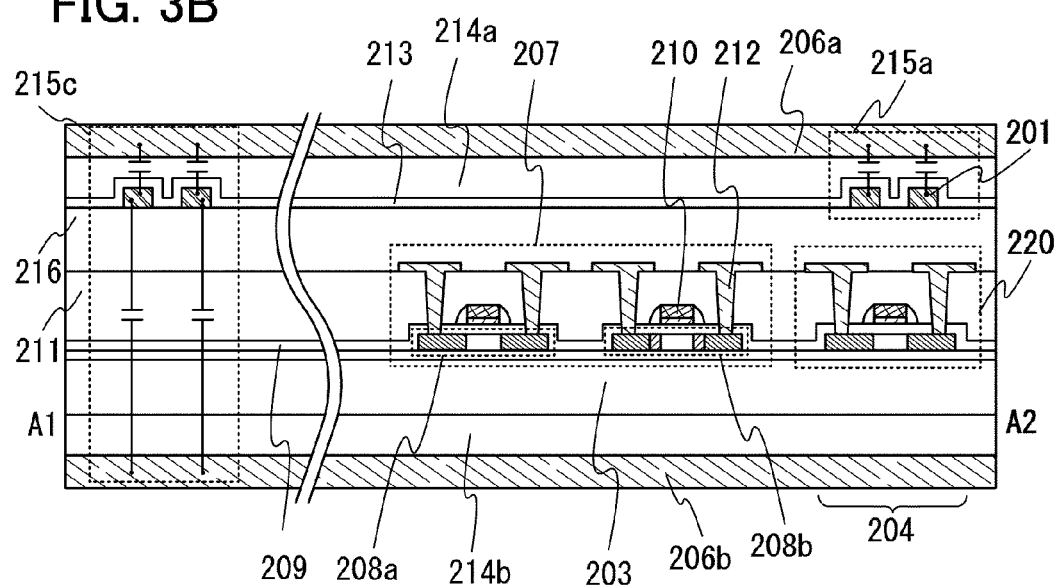

FIGS. 3A and 3B illustrate a structure including the capacitor 215a and the capacitor 215c. Since the capacitor 215a has a structure similar to that in Embodiment 1, description thereof is omitted here. The structure will be described in which the antenna 201 is provided as one of two electrodes of the capacitor 215c, and both the conductive blocking body 206a provided over the substrate 203 and the conductive blocking body 206b provided under the substrate 203 are disposed as the other electrodes. The wireless chip 200 described in this embodiment includes the antenna 201 and the IC chip 202 that are stacked over the same substrate 203. The antenna 201 and the IC chip 202 are disposed so as to be at least partially overlapped with each other with an insulating film interposed therebetween. The IC chip 202 includes the resonant capacitor portion 204 in the chip, which is provided with the capacitor 220, and the logic portion 205 including a power supply generating means, a control means, a memory means, and the like. Note that both terminals of the antenna 201 are electrically connected to the integrated circuit 207 of the logic portion 205. Further, the antenna 201 and conductive blocking body 206a are disposed with insulating films such as the protective film 213 and the impact diffusion layer 214a and are provided on the uppermost surface of the wireless chip 200. Further, the antenna 201 and the conductive blocking body 206b are provided with the substrate 203, the first interlayer insulating film 211, the second interlayer insulating film 216, the protective film 213, the impact diffusion layer 214b, and the like interposed therebetween. Note that the conductive blocking body 206b is provided for the lowermost layer of the wireless chip 200.

Further, the antenna 201 connected to the integrated circuit 207 is disposed with the second interlayer insulating film 216 interposed therebetween. The conductive blocking body 206a and the conductive blocking body 206b are not connected to the antenna 201 physically.

In this embodiment, the conductive blocking body 206a disposed on a top surface of the substrate and the antenna 201 function as electrodes with the protective film 213 and the impact diffusion layer 214a interposed therebetween, so that a resonant capacitor is formed. Further, the conductive blocking body 206b disposed on a bottom surface of the substrate and the antenna 201 function as electrodes with the substrate, the first interlayer insulating film 211, the second interlayer insulating film 216, and the impact diffusion layer 214b interposed therebetween, so that a resonant capacitor is formed. That is, the capacitor 215c includes the resonant capacitor formed between the conductive blocking body 206a and the antenna 201 and the resonant capacitor formed between the conductive blocking body 206b and the antenna 201.

Therefore, since many resonant capacitors are formed in this embodiment as compared to the above embodiment, the number of capacitors in the capacitor 220 of the resonant capacitor portion 204 in the chip can be reduced as compared to that in the above embodiment. Further, since the IC chip 202 is sandwiched between the conductive blocking body 206a and the conductive blocking body 206b, physical strength of the wireless chip can be further increased as compared to the above embodiment.

Note that the structure described in this embodiment is not necessarily employed. An insulating layer other than the protective film and the impact diffusion layer may be disposed and the protective film and the impact diffusion layer are not necessarily disposed as long as a capacitor can be formed.

Embodiment 4

In this embodiment, a wireless chip 200 having a structure different from those of the above embodiments will be described with reference to drawings. In specific, the structure will be described in which the antenna 201 is provided as one of two electrodes of each of capacitors 215d and 215f, and a conductive blocking body 206c provided as the other electrode is disposed so as to surround the other components included in the wireless chip 200.

A structure of a wireless chip 200 in FIG. 4A will be described. FIG. 4B is a cross section taken along line A1-A2 in the wireless chip 200 of FIG. 4A.

Figure 4A:
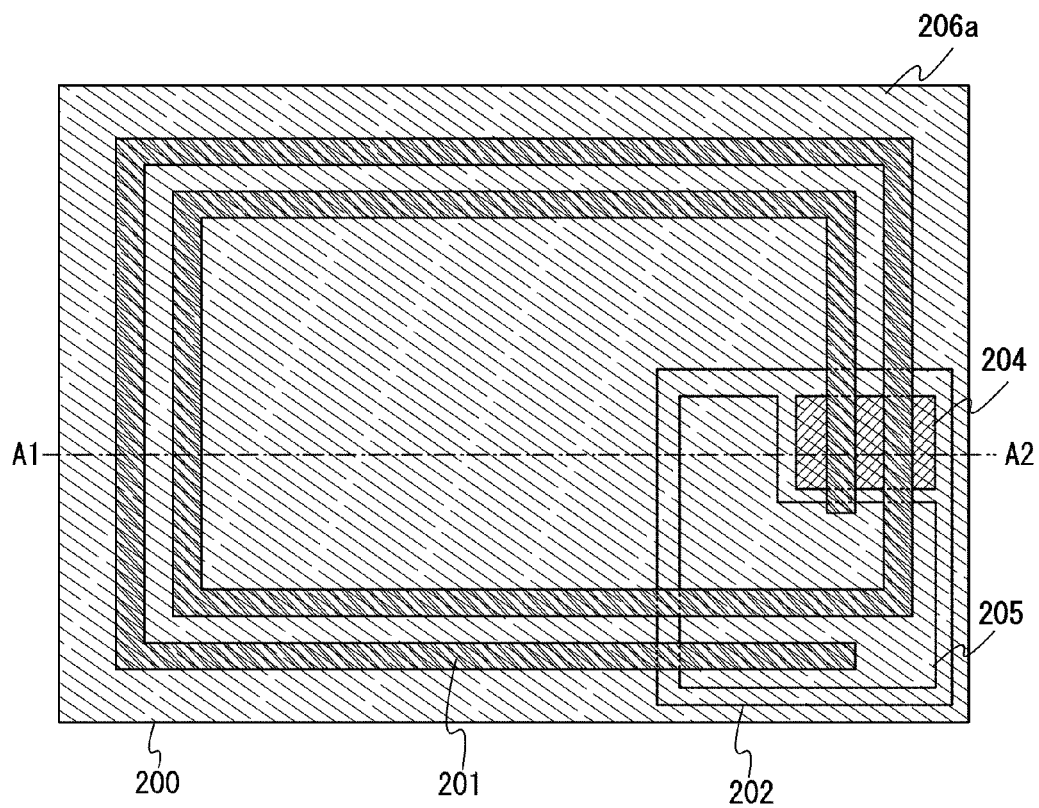
FIGS. 4A and 4B illustrate a structure of a wireless chip of an embodiment of the present invention (Embodiment 4)
Figure 4B:
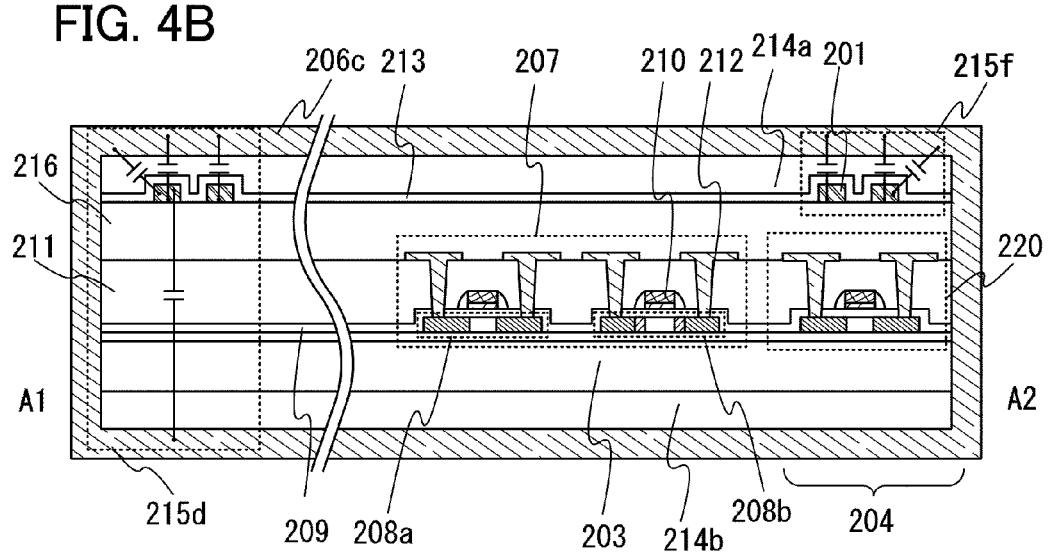

FIGS. 4A and 4B illustrate a structure in which the antenna 201 is provided as one of two electrodes of each of the capacitors 215d and 215f, and the conductive blocking body 206c provided as the other electrode is disposed so as to surround the other components included in the wireless chip 200. The wireless chip 200 described in this embodiment includes the antenna 201 and the IC chip 202 that are stacked over the same substrate 203. The antenna 201 and the IC chip 202 are disposed so as to be at least partially overlapped with each other with an insulating film interposed therebetween. The IC chip 202 includes the resonant capacitor portion 204 in a chip, which is provided with the capacitor 220, and the logic portion 205 including a power supply generating means, a control means, a memory means, and the like. Note that both terminals of the antenna 201 are electrically connected to the integrated circuit 207 of the logic portion 205. Further, the antenna 201 and the conductive blocking body 206c are disposed with insulating films such as the protective film 213 and the impact diffusion layers 214a and 214b interposed therebetween. Note that the conductive blocking body 206c is provided around the outermost perimeter of the wireless chip 200.

Further, the antenna 201 connected to the integrated circuit 207 is disposed with the second interlayer insulating film 216 interposed therebetween. The conductive blocking body 206c is not connected to the antenna 201 physically.

In the above structure, the resonant capacitor is formed using the conductive blocking body 206c surrounding the antenna 201; thus, it is very difficult to accurately illustrate the capacitor 215d formed in this embodiment. In FIGS. 4A and 4B, the capacitor 215d is illustrated in a portion where the resonant capacitor is formed, for example.

Note that the structure described in this embodiment is not necessarily employed as long as the conductive blocking body 206c can be provided around the IC chip and the capacitors 215d and 215f can be formed using the antenna 201 and the conductive blocking body 206c.

With the above structure, many resonant capacitors can be formed as compared to the above embodiments. Further, physical strength can be increased by combining this embodiment and any of the above embodiments.

Embodiment 5

In this embodiment, the wireless chip 200 having a structure different from those of the above embodiments will be described with reference to drawings. In specific, the structure will be described in which a capacitor 215e in which a wiring 217 of the resonant capacitor portion 204 in the chip, which is formed widely, and the conductive blocking body 206a are electrodes is provided in addition to the capacitor 215a in which the antenna 201 and the conductive blocking body 206a are electrodes.

A structure of the wireless chip 200 in FIG. 5A will be described. FIG. 5B is a cross section taken along line A1-A2 in the wireless chip 200 of FIG. 5A.

Figure 5A:
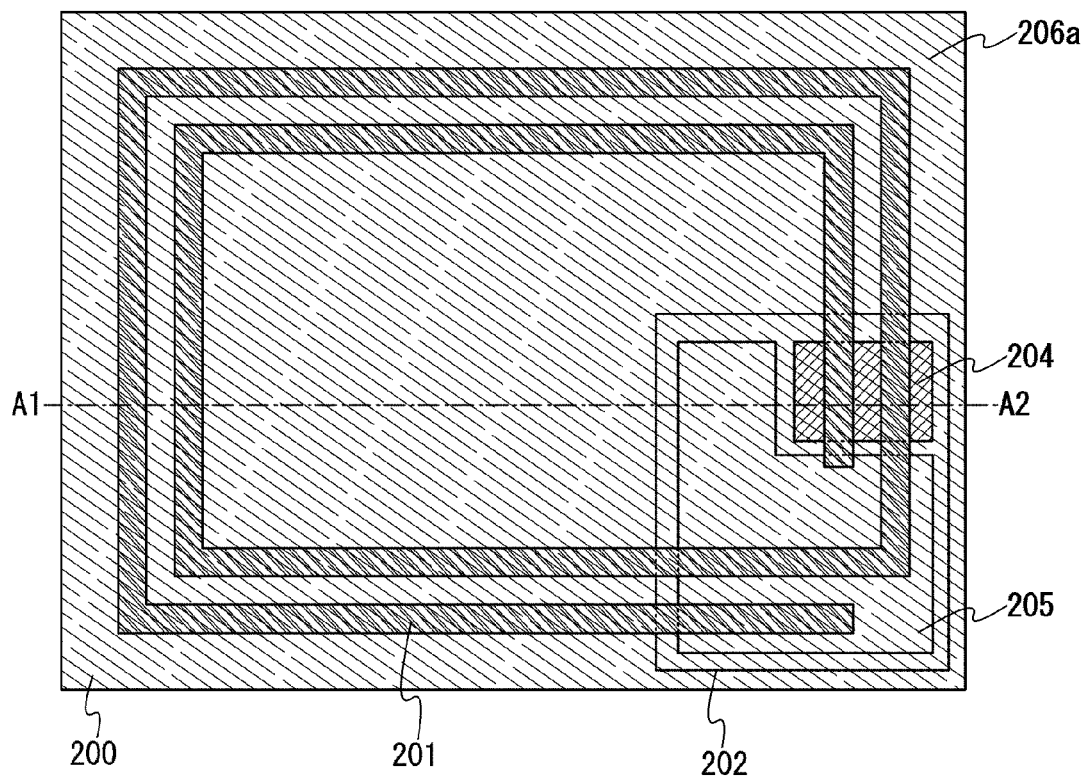
FIGS. 5A and 5B illustrate a structure of a wireless chip of an embodiment of the present invention (Embodiment 5)
Figure 5B:
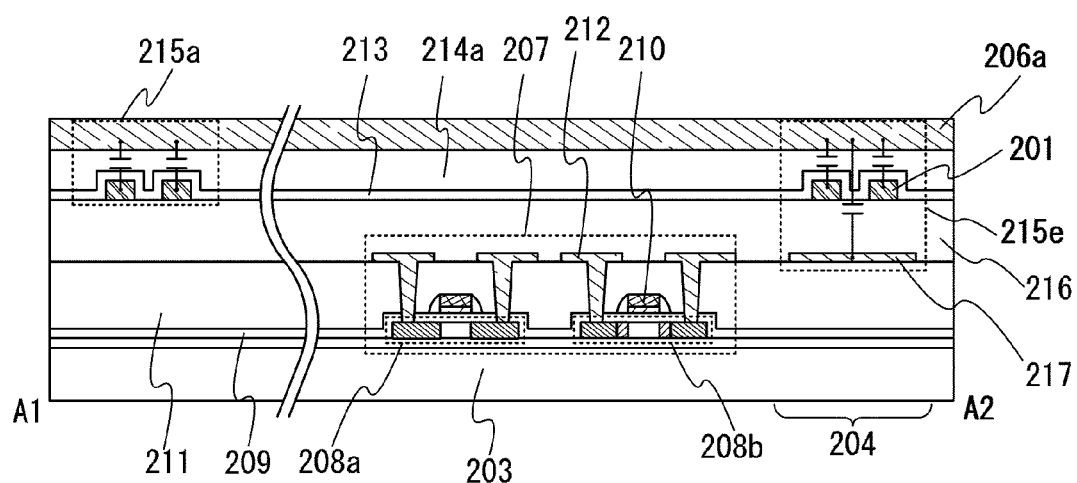

FIGS. 5A and 5B illustrate the structure in which one of two capacitors of the capacitor 215e has the antenna 201 and the conductive blocking body 206a as electrodes and the other has a wiring 217 of the resonant capacitor portion 204 in the chip, which is formed widely, and the conductive blocking body 206a as electrodes. Note that since the wiring 217 can be formed in the same layer and through the same steps as the source and drain electrodes 212, a special step is not required.

The wireless chip 200 described in this embodiment includes the antenna 201 and the IC chip 202 that are stacked over the same substrate 203. The antenna 201 and the IC chip 202 are disposed so as to be at least partially overlapped with each other with an insulating film interposed therebetween. The IC chip 202 includes the resonant capacitor portion 204 in the chip and the logic portion 205 including a power supply generating means, a control means, a memory means, and the like. Note that both terminals of the antenna 201 are electrically connected to the integrated circuit 207 of the logic portion 205. Further, the wiring 217 and the conductive blocking body 206a are disposed with insulating films such as the protective film 213, the impact diffusion layer 214a, and the second interlayer insulating film 216 interposed therebetween, and the conductive blocking body 206a is provided on the uppermost surface of the wireless chip 200.

Further, the antenna 201 connected to the integrated circuit 207 is disposed with the second interlayer insulating film 216 interposed therebetween, and the conductive blocking body 206a is disposed over the antenna 201 with the protective film 213 and the impact diffusion layer 214a interposed therebetween. The conductive blocking body 206a is not connected to the antenna 201 physically.

The capacitor 215e formed in this embodiment includes the capacitor including the antenna 201 and the conductive blocking body 206a as electrodes as in Embodiment 1, and the capacitor including the wiring 217 of the resonant capacitor portion 204 in the chip, in which the wiring 217 is formed widely, and the conductive blocking body 206a as electrodes.

Note that although the structure is described in which the conductive blocking body 206a is provided on an outermost surface as in Embodiment 1, this embodiment can also be implemented in free combination with any of Embodiments 2 to 4. Further, the structure described in this embodiment is not necessarily employed as long as the capacitor 215e can be formed.

With the above structure, the number of capacitors in the chip can be reduced as compared to the case where the conductive blocking body 206a is not provided, which results in reduction in the size of the wireless chip 200 and the size of the IC chip 202, effective utilization of the limited area in the IC chip, reduction in current consumption, and prevention of shortening of a communication distance. Further, by using the conductive blocking body 206a, resistance to static electricity and physical strength of the wireless chip, which becomes a significant problem when the wireless chip is downsized, can be increased.

Further, more capacitors can be formed as compared to Embodiments 1 to 4 which do not employ this structure by combining this structure with any of Embodiments 1 to 4.

Embodiment 6

This embodiment will describe a method for manufacturing a semiconductor device with high reliability and high yield with reference to FIGS. 6A to 6D. Note that although the structure including a substrate is described in Embodiments 1 to 5, this embodiment will describe a method for manufacturing a semiconductor device from which a substrate is separated. Note that any of Embodiments 1 to 5 can be freely combined with this embodiment. Further, this embodiment will describe a CMOS (complementary metal oxide semiconductor) as an example of semiconductor devices.

Figure 6A:
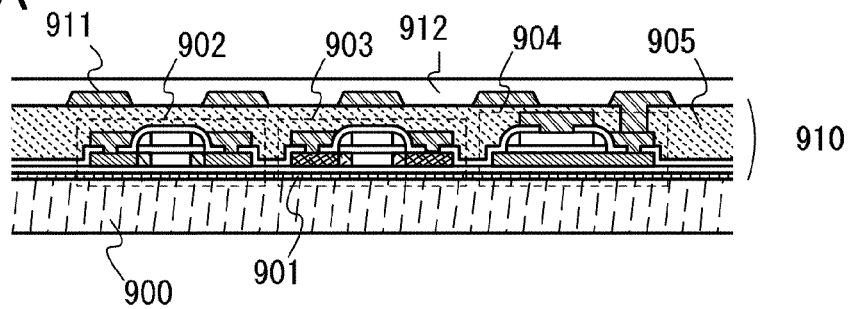
FIGS. 6A to 6D illustrate manufacturing steps of a wireless chip of an embodiment of the present invention (Embodiment 6)
Figure 6B:
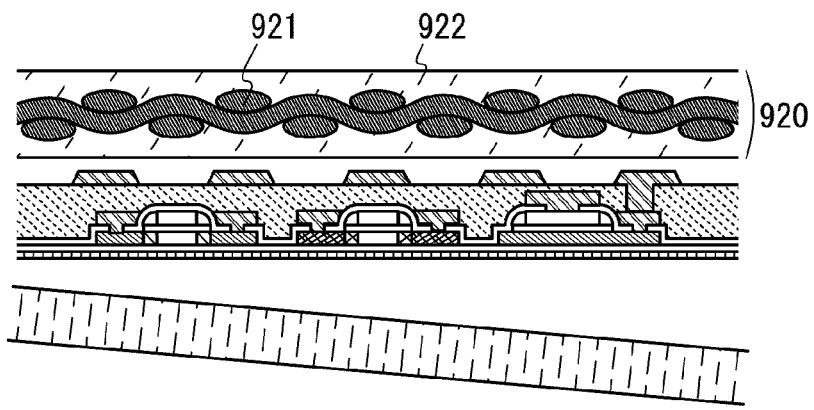

Transistors 902 and 903, a capacitor 904, and an insulating layer 905 are provided over a substrate 900 with a separation layer 901 interposed therebetween, so that a semiconductor integrated circuit 910 is formed (see FIG. 6A). Note that in this embodiment, since a capacitor using a resonant capacitor formed in an IC chip is formed, the capacitor 904 can be smaller than a conventional capacitor.

The transistors 902 and 903 are thin film transistors and each include source and drain regions, a low concentration impurity region, a channel formation region, a gate insulating layer, a gate electrode, wirings serving as source and drain electrodes. The source and drain regions are in contact with and electrically connected with the wirings serving as source and drain electrodes.

The transistor 902 is an n-channel transistor and the source or drain region and the low concentration impurity region include impurity elements imparting n-type conductivity (such as phosphorus (P) or arsenic (As)). The transistor 903 is a p-channel transistor and the source or drain region and the low concentration impurity region include impurities imparting p-type conductivity (such as boron (B), aluminum (Al), or gallium (Ga)).

The capacitor 904 is formed through the same steps as the transistors 902 and 903 and one electrode is formed of a semiconductor layer and the other electrode is formed of the gate electrode. In this case, to secure a capacitance value efficiently, an impurity element may be added to the semiconductor layer included in the capacitor 904 before a gate electrode layer is formed. Through this step, an impurity element is added also to the semiconductor layer disposed in a region of a lower layer of the gate electrode layer, and thus the capacitor 904 can function efficiently as a capacitor.

Next, an antenna 911 is formed over the insulating layer 905 by using a conductive film, and a protective film 912 is formed over the antenna 911. The antenna 911 is electrically connected to the semiconductor integrated circuit. In FIG. 6A, the antenna 911 is electrically connected to one electrode of the capacitor 904.

Next, an impact diffusion layer 920 is formed over the protective film 912. As the impact diffusion layer 920, for example, a structure body in which a fibrous body 921 is impregnated with an organic resin 922 may be used.

After the protective film 912 and the impact diffusion layer 920 are bonded together, the semiconductor integrated circuit 910, the antenna 911, and the protective film 912 are separated from the substrate 900 along the separation layer 901 as an interface. Accordingly, the semiconductor integrated circuit 910, the antenna 911, and the protective film 912 are provided on the impact diffusion layer 920 side (see FIG. 6B).

Although not illustrated particularly, bonding of the protective film 912 and the impact diffusion layer 920 may be performed using an adhesive, pressure bonding, or thermocompression bonding.

Figure 6C:
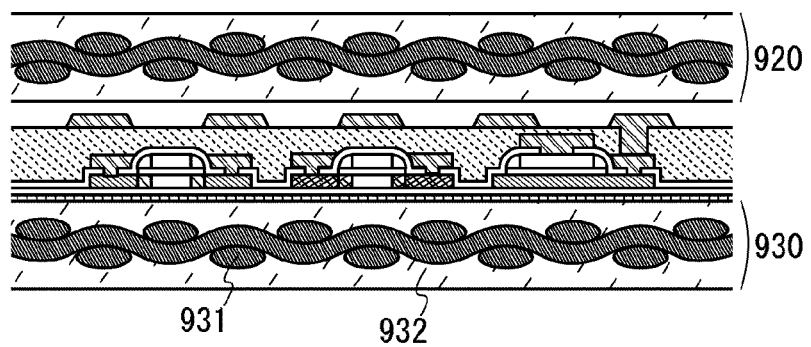
Figure 6D:
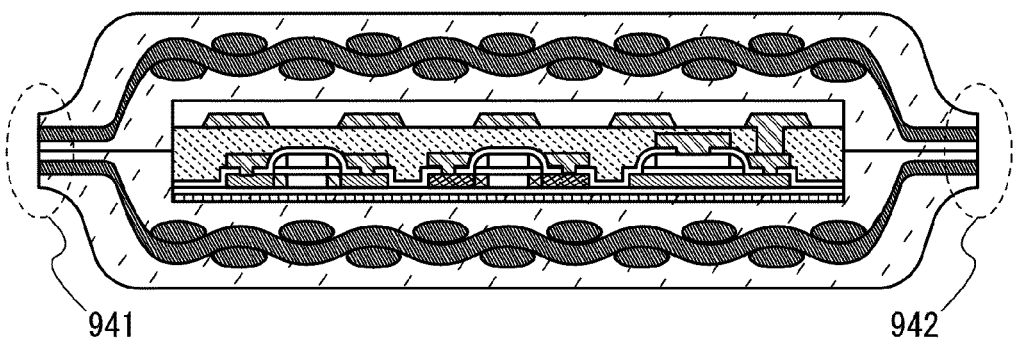

After that, an impact diffusion layer 930 is bonded to an exposed separation surface of the semiconductor integrated circuit 910 with the separation layer 901 interposed therebetween, so that the semiconductor integrated circuit 910, the antenna 911, and the protective film 912 are sandwiched between the impact diffusion layer 920 and the impact diffusion layer 930 (see FIG. 6C).

As the impact diffusion layer 930, for example, a structure body in which a fibrous body 931 is impregnated with an organic resin 932 may be used, similarly to the case of the impact diffusion layer 920.

Although there is no particular illustration, the impact diffusion layer 920 and the impact diffusion layer 930 sandwich a plurality of structure bodies each including the semiconductor integrated circuit 910, the antenna 911, and the protective film 912 so that they are arranged in a planar direction. By division, individual semiconductor integrated circuit chips each having a structure in which the semiconductor integrated circuit 910, the antenna 911, and the protective film 912 are sandwiched between the impact diffusion layer 920 and the impact diffusion layer 930 are manufactured. There is no particular limitation on a dividing means as long as physical division is possible, and as a favorable example, division is performed by laser beam irradiation along a dividing line in this embodiment.

By division by laser beam irradiation, the impact diffusion layer 920 and the impact diffusion layer 930 melt and weld together at dividing surfaces 941 and 942 of the semiconductor integrated circuit chip. Thus, the individual semiconductor integrated circuit chips each have a structure in which the semiconductor integrated circuit 910, the antenna 911, and the protective film 912 are entirely sealed with the impact diffusion layer 920 and the impact diffusion layer 930 (see FIG. 6D).

Although not illustrated particularly, an insulator may be further provided on outer sides or inner sides than the impact diffusion layer 920 and the impact diffusion layer 930 to cover the entire surfaces of the semiconductor integrated circuit 910, the antenna 911, and the protective film 912 more favorably.

Figure 7A:
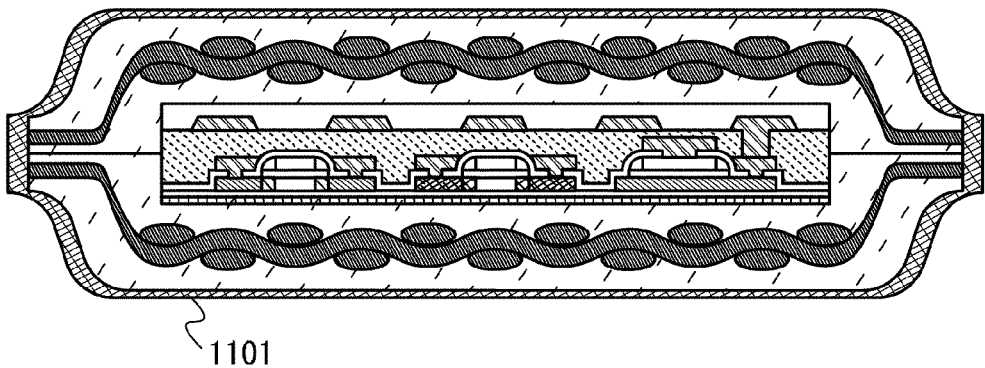
FIGS. 7A to 7C illustrate manufacturing steps of a wireless chip of an embodiment of the present invention (Embodiment 7)

Finally, a conductive blocking body 1101 is provided as illustrated in FIG. 7A, so that the semiconductor device of this embodiment is completed. Note that although FIG. 7A illustrates an example in which the conductive blocking body 1101 is formed so as to entirely cover the outside similarly to the structure described in Embodiment 4, the structure described as an example in any of the other embodiments may be employed. Note that in FIG. 7A, the conductive blocking body 1101 is formed so as to cover a top surface, a bottom surface, and side surfaces of the semiconductor integrated circuit chip. The conductive blocking body 1101 may be formed so as to cover the entire surfaces by forming the conductive blocking body on the top surface and part of the side surfaces and then turning over the semiconductor integrated circuit and forming the conductive blocking body on the bottom surface and part of the side surfaces.

The conductive blocking body 1101 may be formed to a thickness small enough that reception of carrier waves or amplitude modulation waves transmitted from a R/W is not hindered as much as possible.

Figure 7B:
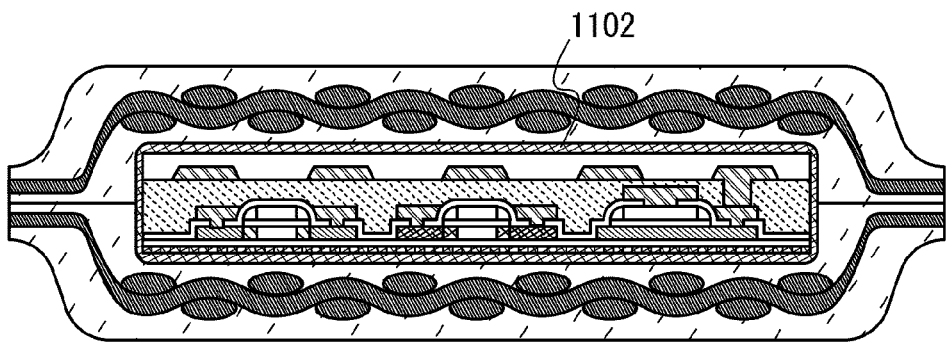

Alternatively, as illustrated in FIG. 7B, a conductive blocking body 1102 may be provided on inner sides than impact diffusion layers so as to cover an entire surface of the semiconductor integrated circuit. To thus form the conductive blocking body 1102 so as to cover the entire surface of the semiconductor integrated circuit, it is required that individual semiconductor integrated circuit chips are formed by division before the semiconductor integrated circuit is sandwiched between the impact diffusion layers and bonding is performed; however, this mode is not necessarily employed. For example, the following method may be employed: a conductive blocking body is formed in advance on a top surface and a bottom surface of the semiconductor integrated circuit before the semiconductor integrated circuit chip is sandwiched between impact diffusion layers and bonding is performed, the semiconductor integrated circuit chip is sandwiched between impact diffusion layers and bonding is performed, and then division is performed by laser beam irradiation, so that the conductive blocking bodies melt at dividing surfaces and weld so as to cover side surfaces of the semiconductor integrated circuit from above and below.

Figure 7C:
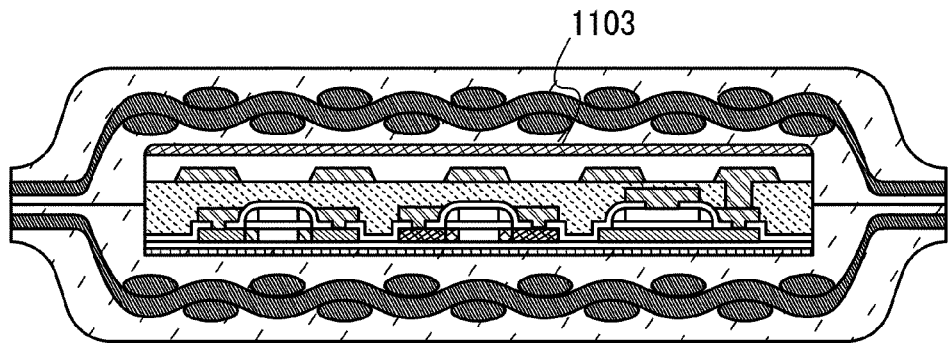
Figure 8A:
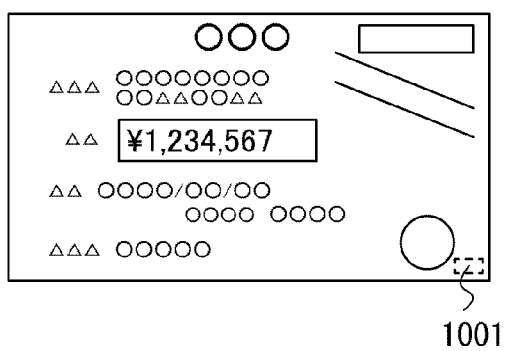
FIGS. 8A to 8G illustrate application examples of a wireless chip of an embodiment of the present invention (Embodiment 8)
Figure 8B:
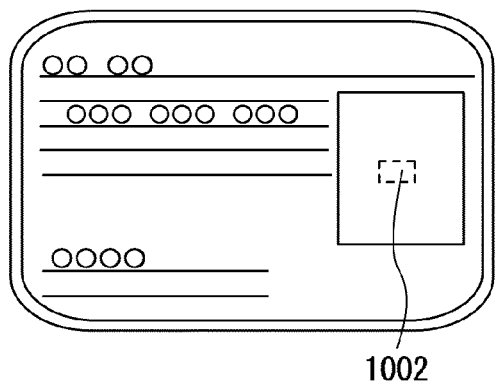
Figure 8C:
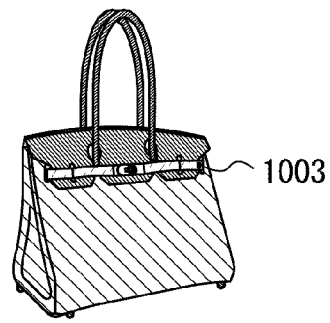
Figure 8D:
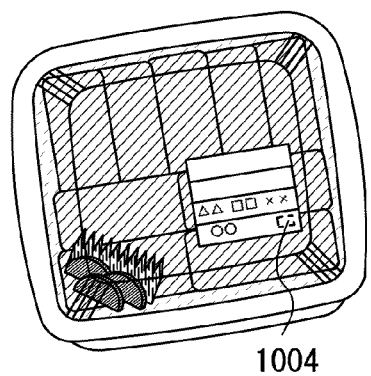
Figure 8E:
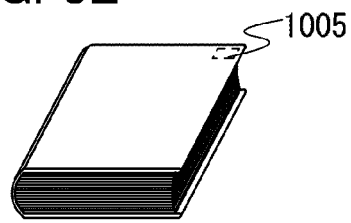
Figure 8F:
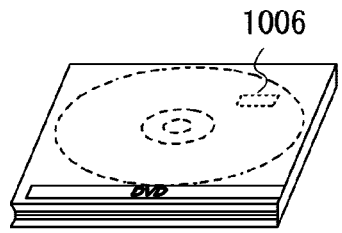
Figure 8G:
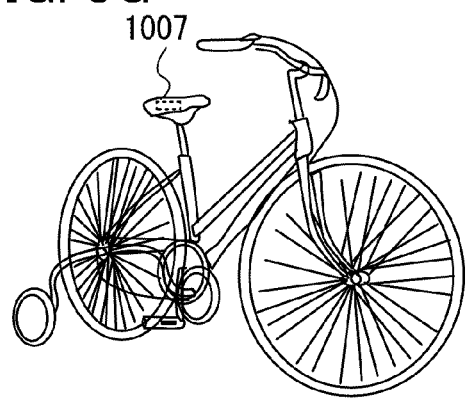

FIG. 7C is an example in which a conductive blocking body 1103 is provided on an inner side than an impact diffusion layer so that it is formed on one surface of a semiconductor integrated circuit. In this example, the conductive blocking body 1103 is formed on the antenna side as in Embodiment 1; however, the conductive blocking body 1103 may be formed on the separation surface side as in Embodiment 2.

By forming the conductive blocking body on one surface of the semiconductor integrated circuit, the conductive blocking body does not hinder reception of carrier waves or amplitude modulation waves transmitted from a R/W and thus favorable communication accuracy can be secured.

By such a formation method, impact diffusion layers are provided with a semiconductor integrated circuit interposed therebetween; therefore, adverse effects such as a damage and a characteristic defect of the semiconductor integrated circuit due to external stress or stress can be prevented also in the manufacturing process. Thus, a semiconductor device can be manufactured with high reliability and high yield.

Note that the semiconductor device manufactured according to this embodiment can be flexible by using a flexible impact diffusion layer.

Semiconductor layers included in the transistors 902 and 903 and the capacitor 904 can be formed using any of the following materials: an amorphous semiconductor manufactured by a vapor-phase growth method or a sputtering method using a semiconductor material gas typified by silane or germane; a polycrystalline semiconductor formed by crystallizing the amorphous semiconductor with the use of light energy or thermal energy; a microcrystalline (also referred to as semiamorphous) semiconductor; or the like. The semiconductor layer can be formed by a sputtering method, an LPCVD method, a plasma CVD method, or the like.

The microcrystalline semiconductor film belongs to a metastable state which is intermediate between an amorphous state and a single crystal state when Gibbs free energy is considered. That is, the microcrystalline semiconductor film is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is shifted to a lower wavenumber than 520 cm$^{-1}$ which represents a peak of the Raman spectrum of single crystal silicon. That is to say, a peak of the Raman spectrum of microcrystalline silicon lies between 520 cm$^{-1}$ and 480 cm$^{-1}$ which represent that of single crystal silicon and that of amorphous silicon, respectively. The microcrystalline semiconductor film contains hydrogen or halogen of at least 1 at. % to terminate dangling bonds. Further, a rare gas element such as helium, argon, krypton, or neon may be contained to further promote lattice distortion, so that stability is enhanced and a favorable microcrystalline semiconductor film can be obtained.

The microcrystalline semiconductor film can be formed by a high-frequency plasma CVD method with a frequency of several tens of MHz to several hundred MHz or a microwave plasma CVD apparatus with a frequency of 1 GHz or more. The microcrystalline semiconductor film can be typically formed using silicon hydride such as $SiH_4$, $Si_2H_6$, $SiH_2Cl_2$, $SiHCl_3$, $SiCl_4$, or $SiF_4$ which is diluted with hydrogen. Alternatively, with a dilution with one or plural kinds of rare gas elements selected from helium, argon, krypton, and neon in addition to silicon hydride and hydrogen, the microcrystalline semiconductor film can be formed. In that case, the flow ratios of hydrogen to silicon hydride is set to be from 5:1 to 200:1, preferably, from 50:1 to 150:1, more preferably, the flow ratio of hydrogen to silicon hydride is set to be 100:1.

Hydrogenated amorphous silicon may be typically used as an amorphous semiconductor, while polysilicon (polycrystalline silicon) and the like may be typically used as a crystalline semiconductor. As examples of polysilicon, so-called high-temperature polysilicon which contains polysilicon as a main component and is formed at a process temperature of 800° C. or higher, so-called low-temperature polysilicon that contains polysilicon as a main component and is formed at a process temperature of 600° C. or lower, polysilicon obtained by crystallizing amorphous silicon by using an element promoting crystallization or the like, and the like are given. It is needless to say that as mentioned above, a microcrystalline semiconductor or a semiconductor containing a crystal phase in part of a semiconductor layer may be used.

As a material of the semiconductor, as well as an elementary substance of silicon (Si), germanium (Ge), or the like, a compound semiconductor such as GaAs, InP, SiC, ZnSe, GaN, or SiGe can be used. Alternatively, an oxide semiconductor such as zinc oxide (ZnO), tin oxide ($SnO_2$), magnesium zinc oxide, gallium oxide, or indium oxide, an oxide semiconductor formed of any of the above oxide semiconductors, or the like may be used. For example, an oxide semiconductor formed of ZnO, indium oxide, and gallium oxide may be used. Note that in the case of using ZnO for the semiconductor layer, a gate insulating layer is preferably formed using $Y_2O_3$, $Al_2O_3$, $TiO_2$, or a stack of any of the above. For the gate electrode layer, the source electrode layer, and the drain electrode layer, indium tin oxide (ITO), Au, Ti, or the like is preferably used. Alternatively, ZnO to which In, Ga, or the like is added may be used.

In the case of using a crystalline semiconductor layer for the semiconductor layer, the crystalline semiconductor layer may be formed by any of various methods (such as a laser crystallization method, a thermal crystallization method, and a thermal crystallization method using an element promoting crystallization, such as nickel). Further, a microcrystalline semiconductor may be crystallized by laser irradiation to enhance crystallinity. In the case where the element promoting crystallization is not introduced, before irradiating the amorphous silicon film with a laser beam, hydrogen is released until the concentrations of hydrogen contained in the amorphous silicon film become $1 \times 10^{20}$ atoms/cm$^3$ or less by heating the amorphous silicon film at a temperature of 500° C. for one hour in a nitrogen atmosphere. This is because the amorphous silicon film containing a large amount of hydrogen is destroyed when being irradiated with a laser beam.

A method for introducing a metal element into the amorphous semiconductor layer is not particularly limited as long as it is capable of introducing the metal element to a surface of or inside the amorphous semiconductor layer. For example, a sputtering method, a CVD method, a plasma treatment method (including a plasma CVD method), an adsorption method, or a method for applying a solution of metal salt can be used. Among them, a method of using a solution is simple and advantageous in that the concentration of the metal element can be easily controlled. At this time, it is desirable to form an oxide film by UV irradiation in an oxygen atmosphere, a thermal oxidation method, treatment with either ozone water containing hydroxyl radicals or hydrogen peroxide, or the like to improve wettability of the surface of the amorphous semiconductor layer so that an aqueous solution is diffused on the entire surface of the amorphous semiconductor layer.

In a crystallization step in which an amorphous semiconductor layer is crystallized to form a crystalline semiconductor layer, an element promoting crystallization (also referred to as a catalytic element or a metal element) may be added to the amorphous semiconductor layer and crystallization may be performed by heat treatment (at 550° C. to 750° C. for 3 minutes to 24 hours). The element promoting crystallization can be one or more of elements such as iron (Fe), nickel (Ni), cobalt (Co), ruthenium (Ru), rhodium (Rh), palladium (Pd), osmium (Os), iridium (Ir), platinum (Pt), copper (Cu), and gold (Au).

In order to remove or reduce the element promoting crystallization from the crystalline semiconductor layer, a semiconductor layer containing an impurity element is formed in contact with the crystalline semiconductor layer and is made to function as a gettering sink. As the impurity element, an impurity element imparting n-type conductivity, an impurity element imparting p-type conductivity, a rare gas element, or the like can be used; for example, one or more of phosphorus (P), nitrogen (N), arsenic (As), antimony (Sb), bismuth (Bi), boron (B), helium (He), neon (Ne), argon (Ar), krypton (Kr), and xenon (Xe) can be used. A semiconductor layer containing a rare gas element is formed on the crystalline semiconductor layer containing the element promoting crystallization, and heat treatment (at 550° C. to 750° C. for 3 minutes to 24 hours) is performed. The element promoting crystallization, which is contained in the crystalline semiconductor layer, moves into the semiconductor layer containing a rare gas element and thus, the element promoting crystallization, which is contained in the crystalline semiconductor layer, is removed or reduced. After that, the semiconductor layer containing a rare gas element, which has served as a gettering sink, is removed.

An amorphous semiconductor layer may be crystallized by the combination of heat treatment and laser beam irradiation, or one of heat treatment and laser beam irradiation may be performed a plurality of times.

A crystalline semiconductor layer may be directly formed on a substrate by a plasma method. Alternatively, a crystalline semiconductor layer may be selectively formed over a substrate by a plasma method.

The gate insulating layer may be formed using silicon oxide or may be formed to have a layered structure including silicon oxide and silicon nitride. The gate insulating layer may be formed by depositing an insulating film by a plasma CVD method or a low pressure CVD method or may be formed by solid-phase oxidation or solid-phase nitridation by plasma treatment. This is because a gate insulating layer which is formed using a single crystal semiconductor layer which is oxidized or nitrided by plasma treatment is dense, has high withstand voltage, and is excellent in reliability. For example, a surface of the semiconductor layer is oxidized or nitrided using nitrous oxide ($N_2O$) diluted with Ar by 1 to 3 times (flow ratio) by application of microwave (2.45 GHz) powers of 3 kW to 5 kW at pressures of 10 Pa to 30 Pa. By this treatment, an insulating film with thicknesses of 1 nm to 10 nm (preferably, 2 nm to 6 nm) is formed. Further, nitrous oxide ($N_2O$) and silane ($SiH_4$) are introduced and microwave (2.45 GHz) powers of 3 kW to 5 kW are applied to the insulating film at pressures of 10 Pa to 30 Pa to form a silicon oxynitride film by a vapor-phase growth method, which is to be a gate insulating layer. With a combination of a solid-phase reaction and a reaction by a vapor-phase growth method, the gate insulating layer with low interface state density and an excellent withstand voltage can be formed.

As the gate insulating layer, a high dielectric constant material such as zirconium dioxide, hafnium oxide, titanium dioxide, or tantalum pentoxide may be used. By using a high dielectric constant material for the gate insulating layer, a gate leakage current can be reduced.

The gate electrode layer can be formed employing a CVD method, a sputtering method, a droplet discharge method, or the like. The gate electrode layer may be formed of an element selected from Ag, Au, Cu, Ni, Pt, Pd, Ir, Rh, W, Al, Ta, Mo, Cd, Zn, Fe, Ti, Si, Ge, Zr, and Ba; or an alloy or compound material containing any of the elements as its main component. Alternatively, a semiconductor film typified by a polycrystalline silicon film doped with an impurity element such as phosphorus, or an AgPdCu alloy may be used. Further, either a single-layer structure or a multi-layer structure may be employed; for example, a two-layer structure of a tungsten nitride film and a molybdenum film may be employed or a three-layer structure in which a tungsten film with a thickness of 50 nm, a film of an aluminum-silicon (Al—Si) alloy with a thickness of 500 nm, and a titanium nitride film with a thickness of 30 nm are stacked in this order may be employed. In the case of the three-layer structure, a tungsten nitride film may be used instead of the tungsten film as the first conductive film, an aluminum-titanium (Al—Ti) alloy film may be used instead of the aluminum-silicon (Al—Si) alloy film as the second conductive film, and a titanium film may be used instead of the titanium nitride film as the third conductive film.

As the gate electrode layer, a light-transmitting material which transmits visible light may be used. As a light-transmitting conductive material, indium tin oxide (ITO), indium tin oxide containing silicon oxide (ITSO), organoindium, organotin, zinc oxide, or the like can be used. Alternatively, indium zinc oxide (IZO) containing zinc oxide (ZnO), zinc oxide (ZnO), ZnO doped with gallium (Ga), tin oxide (SnO$_2$), indium oxide containing tungsten oxide, indium zinc oxide containing tungsten oxide, indium oxide containing titanium oxide, indium tin oxide containing titanium oxide, or the like may be used.

In the case where etching processing is needed to form the gate electrode layer, a mask may be formed and dry etching or wet etching may be performed. The electrode layers can be etched to have a tapered shape by using an ICP (inductively coupled plasma) etching method and appropriately controlling the etching condition (the amount of power applied to a coiled electrode, the amount of power applied to an electrode on a substrate side, the temperature of the electrode on the substrate side, or the like). Note that as an etching gas, a chlorine-based gas typified by Cl$_2$, BCl$_3$, SiCl$_4$, CCl$_4$, and the like; a fluorine-based gas typified by CF$_4$, SF$_6$, NF$_3$, and the like; or O$_2$ can be used as appropriate.

Although a single-gate structure is described as a transistor structure in this embodiment, a multi-gate structure such as a double-gate structure may alternatively be employed. In this case, gate electrode layers may be provided above and below the semiconductor layer or a plurality of gate electrode layers may be provided only on one side of (above or below) the semiconductor layer.

Alternatively, silicides may be provided over the source and drain regions of the transistor. The silicides are formed by forming conductive films over the source and drain regions of the semiconductor layer and reacting silicon in the exposed source and drain regions of the semiconductor layer with the conductive films by heat treatment, a GRTA method, an LRTA method, or the like. Alternatively, the silicides may be formed by laser irradiation or light irradiation using a lamp. As a material used for forming the silicide, any of the followings can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), and the like.

The wiring layers each function as a source electrode layer or a drain electrode layer can be formed by depositing a conductive film by a PVD method, a CVD method, an evaporation method, or the like, and then etching the conductive film such that it has desired shapes. Alternatively, the wiring layer can be formed selectively at a predetermined place by a printing method, an electroplating method, or the like. Alternatively, a reflow method or a damascene method may be used. As a material of the wiring layers, metal such as Ag, Au, Cu, Ni, Pt, Pd, Ir, Rh, W, Al, Ta, Mo, Cd, Zn, Fe, Ti, Zr, or Ba, a semiconductor such as Si or Ge, or an alloy or a nitride thereof may be used. Alternatively, a light-transmitting material may be used.

As the light-transmitting conductive material, indium tin oxide (ITO), indium tin oxide containing silicon oxide (ITSO), indium zinc oxide (IZO) containing zinc oxide (ZnO), zinc oxide (ZnO), ZnO doped with gallium (Ga), tin oxide (SnO$_2$), indium oxide containing tungsten oxide, indium zinc oxide containing tungsten oxide, indium oxide containing titanium oxide, indium tin oxide containing titanium oxide, or the like can be used.

A material for forming the conductive blocking body is preferably a conductor or a semiconductor; for example, a metal film, a metal oxide film, a semiconductor film, a metal nitride film, and the like are given. Specifically, the conductive blocking body may be formed using an element selected from titanium, molybdenum, tungsten, aluminum, copper, silver, gold, nickel, platinum, palladium, iridium, rhodium, tantalum, cadmium, zinc, iron, silicon, germanium, zirconium, and barium; or an alloy material, a compound material, a nitride material, or an oxide material each containing any of the above elements as a main component.

As the nitride material, tantalum nitride, titanium nitride, or the like can be used.

As the oxide material, indium tin oxide (ITO), indium tin oxide containing silicon oxide (ITSO), organoindium, organotin, zinc oxide, or the like can be used. Alternatively, indium zinc oxide (IZO) containing zinc oxide (ZnO), zinc oxide (ZnO), ZnO containing gallium (Ga), tin oxide (SnO$_2$), indium oxide containing tungsten oxide, indium zinc oxide containing tungsten oxide, indium oxide containing titanium oxide, indium tin oxide (ITO) containing titanium oxide, or the like may be used.

Alternatively, a semiconductor film having conductivity, which is obtained by adding an impurity element or the like to a semiconductor, or the like can be used. For example, a polycrystalline silicon film doped with an impurity element such as phosphorus can be used.

Still alternatively, a conductive macromolecule (also referred to as a conductive polymer) may be used for the conductive blocking body. As the conductive macromolecule, a so-called π-electron conjugated conductive macromolecule can be used. For example, polyaniline and/or a derivative thereof, polypyrrole and/or a derivative thereof, polythiophene and/or a derivative thereof, and a copolymer of two or more kinds of those materials can be given.

Specific examples of a conjugated conductive macromolecule are as follows: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), and poly(3-anilinesulfonic acid).

The conductive blocking body containing a conductive macromolecule may contain an organic resin or a dopant (a halogen, a Lewis acid, an inorganic acid, an organic acid, a transition metal halide, an organic cyano compound, a nonionic surfactant, or the like).

The conductive blocking body can be formed by a dry process such as a sputtering method, a plasma CVD method, or an evaporation method, or a wet process such as a coating method, a printing method, or a droplet discharge method (inkjet method).

Embodiment 7

According to an embodiment of the present invention, a semiconductor device that serves as a wireless tag (hereinafter also referred to as a wireless chip, a wireless processor, or a wireless memory) can be formed. The application range of the semiconductor device according to an embodiment of the present invention is so wide that it may be applied to any object in order that the history thereof or the like is revealed without contact and utilized in production, management, and the like. For example, the semiconductor device may be incorporated in bills, coins, securities, certificates, bearer bonds, containers for packages, books, recording media, personal belongings, vehicles, groceries, garments, healthcare items, daily commodities, medicals, electronic appliances, or the like. These examples are described with reference to FIGS. 8A to 8G.

The bills and coins are money that circulates in the market, and includes one that can be used in the same way as money in a specific area (cash voucher), a commemorative coin, and the like. The securities include checks, certificates, promissory notes, and the like and can each be provided with a chip 1001 including a processor circuit (see FIG. 8A). The certificates refer to driver's licenses, certificates of residence, and the like and can each be provided with a chip 1002 including a processor circuit (see FIG. 8B). The personal belongings include bags, pairs of glasses, and the like and can each be provided with a chip 1003 including a processor circuit (see FIG. 8C). The bearer bonds refer to stamps, rice coupons, various merchandise coupons, and the like. The containers for packages refer to wrapping paper for food containers, plastic bottles, and the like and can each be provided with a chip 1004 including a processor circuit (see FIG. 8D). The books refer to hardbacks, paperbacks, and the like and can each be provided with a chip 1005 including a processor circuit (see FIG. 8E). The recording media refer to DVD software, video tapes, and the like and can each be provided with a chip 1006 including a processor circuit (see FIG. 8F). The vehicles refer to wheeled vehicles such as bicycles, ships, and the like and can each be provided with a chip 1007 including a processor circuit (see FIG. 8G). The groceries indicate foods, beverages, and the like. The garments indicate clothes, shoes, and the like. The healthcare items indicate a medical apparatus, a health appliance, and the like. The daily commodities indicate furniture, lighting apparatus, and the like. The medicals indicate a drug, an agricultural chemical, and the like. The electronic appliances indicate a liquid crystal display device, an EL display device, television sets (a television receiver and a thin television receiver), a cellular phone, and the like.

The semiconductor device can be provided by being attached to the surface of an article or being embedded in an article. For example, in the case of a book, the semiconductor device may be embedded in the paper; and in the case of a package made of an organic resin, the semiconductor device may be embedded in the organic resin.

As described above, the efficiency of an inspection system, a system used in a rental shop, or the like can be improved by providing the containers for packages, the recording media, the personal belongings, the groceries, the garments, the daily commodities, the electronic appliances, or the like with the semiconductor devices. In addition, by providing the vehicles with the semiconductor devices, forgery or theft can be prevented. In addition, when the semiconductor devices are implanted into creatures such as animals, each creature can be identified easily. For example, by implanting/attaching the semiconductor device with a sensor in/to a creature such as livestock, its health condition such as a current body temperature as well as its birth year, sex, breed, or the like can be easily managed.

Note that this embodiment can be implemented in combination with any of Embodiments 1 to 7 and Example 1, as appropriate.

Example 1

Example 1 will describe results obtained by measuring and comparing resonant capacitance in IC chips of a wireless chip having a structure in which a conductive blocking body is provided on top and bottom surfaces of the IC chip, which is described in Embodiment 3, and a wireless chip provided with no conductive blocking body.

Figure 9:
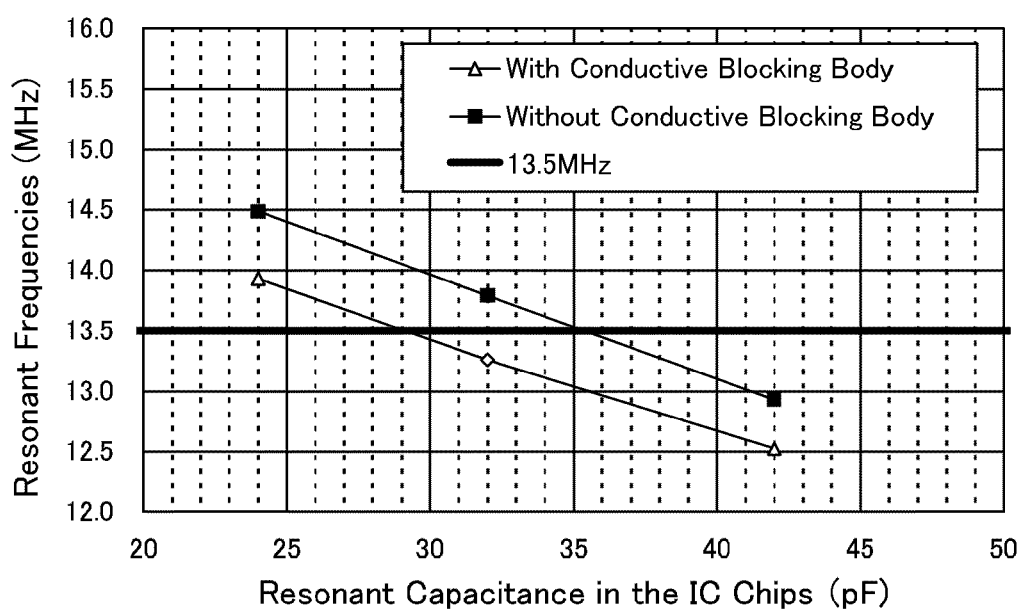
FIG. 9 shows results of measurement of resonant frequencies with respect to resonant capacitance in IC chips (Example 1)

FIG. 9 shows results of measurement of resonant frequencies with respect to resonant capacitance in the IC chips of the wireless chip provided with a conductive blocking body, according to an embodiment of the present invention, and the conventional wireless chip provided with no conductive blocking body. Each of the wireless chips has an antenna with a size (a length from one edge to the other edge of the outermost perimeter of the antenna) of 6 mm Resonant frequencies (MHz) are plotted on the vertical axis with in-chip resonant capacitance (pF) represented on the horizontal axis.

Note that as for the antennas used for measurement in this case, the line width is 135 µm, the distance between lines is 5 µm, and the number of coils is 15. Further, the antenna used for measurement in this case is formed using Al to a thickness of 5 µm. Measurement on the wireless chip provided with a conductive blocking body, according to an embodiment of the present invention, and the conventional wireless chip provided with no conductive blocking body is performed under the condition that in-chip resonant capacitance in the IC chips are 24, 32, and 42 pF.

For example, in the case where a desired resonant frequency is 13.5 MHz, in-chip resonant capacitance required in the wireless chip provided with a conductive blocking body, according to an embodiment of the present invention, is about 29 pF. On the other hand, in-chip resonant capacitance required in the wireless chip provided with no conductive blocking body is about 35 pF.

That is to say, by providing a conductive blocking body, in-chip resonant capacitance can be reduced by about 6 pF.

Figure 10:
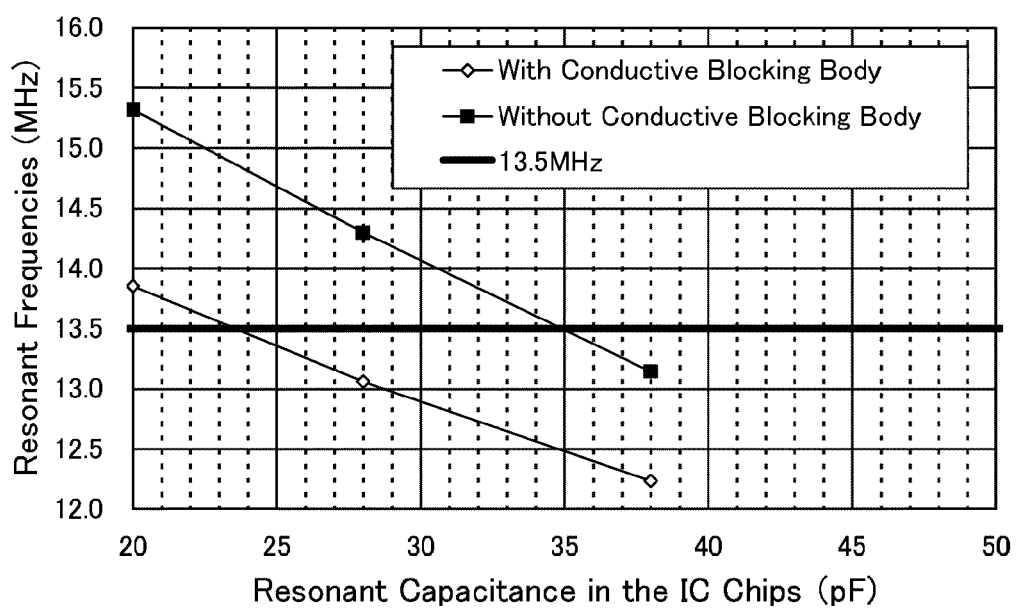
FIG. 10 shows results of measurement of resonant frequencies with respect to resonant capacitance in IC chips (Example 1).

Next, FIG. 10 shows results of measurement of resonant frequencies with respect to resonant capacitance in the IC chips of the wireless chips each having an antenna with a size (a length from one edge to the other edge of the outermost perimeter of the antenna) of 8 mm. Note that resonant frequencies are plotted on the vertical axis with in-chip resonant capacitance represented on the horizontal axis.

Note that as for the antennas used for measurement in this case, the line width is 105 μm, the distance between lines is 5 μm, and the number of coils is 17. The antenna is formed using Al to a thickness of 5 μm. Measurement on the wireless chip provided with a conductive blocking body, according to an embodiment of the present invention, and the conventional wireless chip provided with no conductive blocking body is performed under the condition that in-chip resonant capacitance in the IC chips are 20, 28, and 38 pF.

For example, in the case where a desired resonant frequency is 13.5 MHz, in-chip resonant capacitance required in the wireless chip provided with a conductive blocking body is about 24 pF. On the other hand, in-chip resonant capacitance required in the wireless chip provided with no conductive blocking body is about 35 pF.

That is to say, by providing a conductive blocking body, in-chip resonant capacitance can be reduced by about 11 pF.

According to the measurement results shown in FIGS. 9 and 10, it is understood that provision of a conductive blocking body can reduce resonant capacitance in the IC chip, which leads to downsizing of the IC chip.

This application is based on Japanese Patent Application serial no. 2008-256056 filed with Japan Patent Office on Oct. 1, 2008, the entire contents of which are hereby incorporated by reference.

The invention claimed is:

1. A semiconductor device comprising:
a first insulating film;
an IC chip provided with an integrated circuit, the IC chip being provided over the first insulating film;
an interlayer insulating film provided over the IC chip;
an antenna provided over the interlayer insulating film, wherein the antenna has a coil shape;
a second insulating film provided over the antenna; and
a conductive blocking body including a first portion and a second portion, wherein the first portion is over the second insulating film and the second portion is under the first insulating film,
wherein the conductive blocking body entirely encapsulates and seals the IC chip, the antenna, the first insulating film and the second insulating film,
wherein the second portion of the conductive blocking body, the first insulating film, and the antenna constitute a first capacitor, and
wherein the first portion of the conductive blocking body, the second insulating film, and the antenna constitute a second capacitor.

2. The semiconductor device according to claim 1, further comprising:
a first impact diffusion layer between the first insulating film and the second portion of the conductive blocking body; and
a second impact diffusion layer between the second insulating film and the first portion of the conductive blocking body.

3. The semiconductor device according to claim 2, wherein each of the first impact diffusion layer and the second impact diffusion layer is a structure body in which a fibrous body is impregnated with an organic resin.

4. The semiconductor device according to claim 1, wherein the IC chip comprises a transistor, and wherein the transistor comprises an oxide semiconductor layer.

5. A semiconductor device comprising:
a first insulating film;
an IC chip provided with an integrated circuit, the IC chip being provided over the first insulating film;
an interlayer insulating film provided over the IC chip;
an antenna provided over the interlayer insulating film, wherein the antenna has a coil shape;
a second insulating film provided over the antenna; and
a conductive blocking body provided so as to entirely encapsulate and seals the IC chip, the antenna, the first insulating film and the second insulating film,
wherein the antenna, the second insulating film, and the conductive blocking body constitute a first capacitor.

6. The semiconductor device according to claim 5, wherein the IC chip is further provided with a resonant capacitor portion.

7. The semiconductor device according to claim 6, wherein the resonant capacitor portion includes a wiring, and
wherein the resonant capacitor portion, the second insulating film, and the conductive blocking body constitute a second capacitor.

8. The semiconductor device according to claim 5, further comprising:
a first impact diffusion layer between the first insulating film and the conductive blocking body; and
a second impact diffusion layer between the second insulating film and the conductive blocking body.

9. The semiconductor device according to claim 5, wherein the IC chip comprises a transistor, and wherein the transistor comprises an oxide semiconductor layer.

10. The semiconductor device according to claim 5, wherein the conductive blocking body includes a first portion, a second portion, and a third portion,
wherein the first portion is over an upper surface of the second insulating film,
wherein the second portion is under a lower surface of the first insulating film, and
wherein the third portion is in contact with a side surface of the first insulating film and a side surface of the second insulating film.

* * * * *